(12) United States Patent
Marzynski et al.

(10) Patent No.: US 8,405,380 B2
(45) Date of Patent: Mar. 26, 2013

(54) DIGITAL MULTIMETERS INCLUDING A REMOTE DISPLAY

(75) Inventors: Matthew Marzynski, Seattle, WA (US); Edmond Eng, Kirkland, WA (US)

(73) Assignee: Fluke Corporation, Everett, WA (US)

(*) Notice: Subject to any disclaimer, the term of this patent is extended or adjusted under 35 U.S.C. 154(b) by 55 days.

(21) Appl. No.: 12/568,602

(22) Filed: Sep. 28, 2009

(65) Prior Publication Data

US 2011/0074395 A1    Mar. 31, 2011

(51) Int. Cl.
*G01R 1/00* (2006.01)
(52) U.S. Cl. .................. 324/114; 324/116; 324/99 D
(58) Field of Classification Search ........... 324/99 D, 324/114–116, 117 R, 117 H, 126, 127
See application file for complete search history.

(56) References Cited

U.S. PATENT DOCUMENTS

| | | | |
|---|---|---|---|
| 4,942,356 A * | 7/1990 | Ellingen et al. | 324/156 |
| D332,227 S | 1/1993 | Kaneko | |
| 5,227,984 A | 7/1993 | Meldrum et al. | |
| 5,640,155 A * | 6/1997 | Springer | 340/870.28 |
| 6,043,640 A * | 3/2000 | Lauby et al. | 324/127 |
| D446,735 S | 8/2001 | McCain | |
| D472,828 S | 4/2003 | Chang | |
| 6,812,685 B2 * | 11/2004 | Steber et al. | 324/72.5 |
| D510,533 S | 10/2005 | Hoofnagle | |
| D552,497 S | 10/2007 | Parker | |
| 7,304,618 B2 * | 12/2007 | Plathe | 345/2.3 |
| D569,749 S | 5/2008 | Silverio et al. | |
| D601,047 S | 9/2009 | Chang | |
| D642,944 S | 8/2011 | Laurino et al. | |
| 2003/0137310 A1 * | 7/2003 | Holzel | 324/537 |
| 2005/0087603 A1 * | 4/2005 | Koenck et al. | 235/472.02 |
| 2010/0181990 A1 | 7/2010 | Hudson et al. | |

OTHER PUBLICATIONS

European Patent Application No. 10177477.6, European Search Report, 5 pages, Nov. 8, 2010.
Fluke Corporation, Press Release for "Fluke 233 Remote Display Multimeter Brings Wireless Technology to Contact Electrical Measurement," 2 pages, Sep. 21, 2009.

* cited by examiner

*Primary Examiner* — Arleen M Vazquez
(74) *Attorney, Agent, or Firm* — Perkins Coie LLP

(57) ABSTRACT

A digital multimeter includes a body having a function selector and a first coupler and includes a head having a display and a second coupler. The function selector selects a parameter to be measured, and the display displays a measurement corresponding to the parameter to be measured. The first and second couplers are engaged in a first arrangement joining the body and the head, and the first and second couplers are disengaged in a second arrangement separating the body and the head.

20 Claims, 28 Drawing Sheets

DIGITAL MULTIMETERS INCLUDING A REMOTE DISPLAY

TECHNICAL FIELD

The present disclosure relates generally to digital multimeters. More particularly, the present disclosure relates to a digital multimeter including a remote display on a head that is separable from a body of the digital multimeter.

BACKGROUND

A digital multimeter ("DMM") is adapted for measuring a number of parameters generally needed for service, troubleshooting, and maintenance applications. Such parameters typically include alternating current (a.c.) voltage and current, direct current (d.c.) voltage and current, and resistance or continuity. Other parameters including frequency, capacitance, and temperature may also be measured to meet the requirements of a particular application.

Conventional DMMs include a unitary housing or case to which one or more probes may be attached. Examples of conventional probes include test leads, current clamps, or combinations of both. The housings of conventional DMMs support the various electrical components for measuring and displaying the parameters. Examples of conventional displays include analog gauges, light emitting diodes, and liquid crystal displays.

DMMs are frequently used in environments that make it difficult for a user to see and/or read the display. For example, when analyzing an electrical circuit of a vehicle, the probes may be connected in the engine compartment whereas the user may be located in the passenger compartment. As such, it is frequently the case that a conventional DMM cannot be positioned so as to be seen by the user. It is also frequently the case that conventional DMMs cannot be oriented such that a user can read the display. For example, a conventional clamp-on DMM may be applied around a conductor such that a user cannot read the display.

DETAILED DESCRIPTION

A. Overview

The present disclosure relates generally to digital multimeters. One embodiment of a digital multimeter can include a body including a function selector and a first coupler and a head including a display and a second coupler. The function selector is configured to select a parameter to be measured, and the display is configured to display a measurement corresponding to the parameter to be measured. The first and second couplers are engaged in a first arrangement joining the body and the head, and the first and second couplers are disengaged in a second arrangement separating the body and the head.

Another embodiment of a digital multimeter according to the present disclosure can include, for example, a body including a function selector, and a head including a display. The body and the head are configured to be separated and rejoined.

A method of remotely displaying a measured electrical parameter with respect to measuring the electrical parameter can include, for example, disjoining a display with respect to a sensor and communicating the measured electrical parameter from the sensor to the display. The display is configured to display the measured electrical parameter and the sensor is configured to measure the electrical parameter.

Specific details of embodiments according to the present disclosure are described below with reference to a digital multimeter with a removable display. Other embodiments of the disclosure can have configurations, components, features or procedures different than those described in this section. A person of ordinary skill in the art, therefore, will accordingly understand that the disclosure may have other embodiments with additional elements, or the disclosure may have other embodiments without several of the elements shown and described below with reference to FIGS. 1-28.

B. Embodiments of Digital Multimeters Including a Remote Display

FIGS. 1-10 are views of a DMM 10 including a body 100 and a head 200 according to an embodiment of the present disclosure. FIGS. 11-20 are views of the body 100 per se and FIGS. 21-28 are views of the head 200 per se. The body 100 and the head 200 may be separated from one another and rejoined together according to embodiments of the present disclosure.

Figure 1:
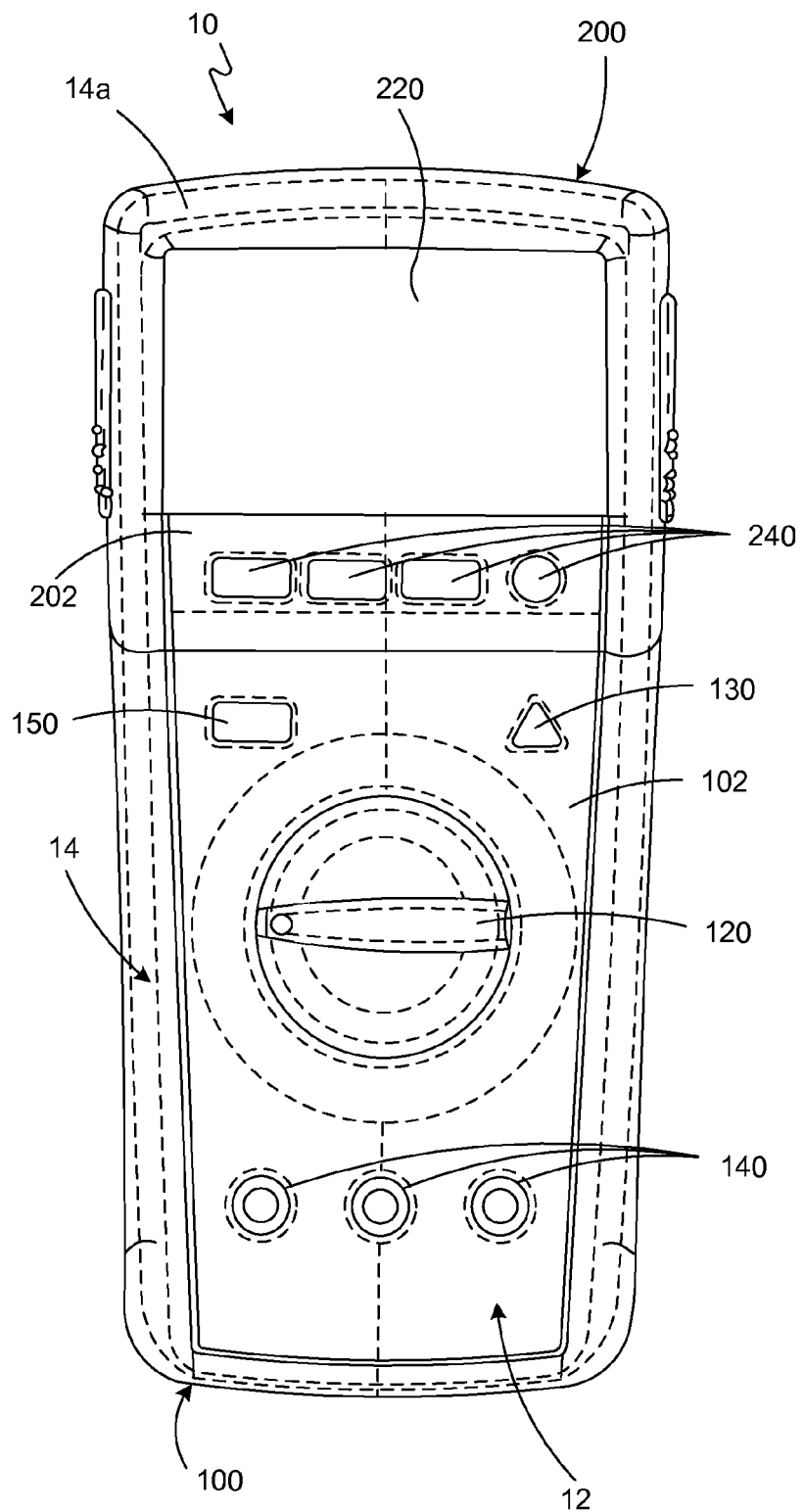
FIG. 1 is front elevation view of a DMM with a remote display according to an embodiment of the present disclosure.

FIG. 1 is a front elevation view showing a front face 12 of the DMM 10 surrounded by a jacket 14. In particular, the front face 12 includes a front face portion 102 of the body 100 and a front face portion 202 of the head 200. As will be discussed in greater detail with respect to FIG. 11, the front face portion 102 may include a rotary selector 120, a hazardous voltage indicator 130, and a plurality of jacks 140. The front face portion 102 may also include one or more additional controls 150. As will be discussed in greater detail with respect to FIG. 21, the front face portion 202 may include a display 220 and at least one control 240.

The jacket 14 includes a ridge 14a that projects upward from around at least a portion of the front face 12. According to certain embodiments of the present disclosure, the ridge 14a may prevent or eliminate contact with the front 12, the hazardous voltage indicator 130, the plurality of jacks 140, any additional controls 150, the display 220 and/or the plurality of controls 240 if the DMM 10 falls with the front face 12 oriented generally downward.

Figure 2:
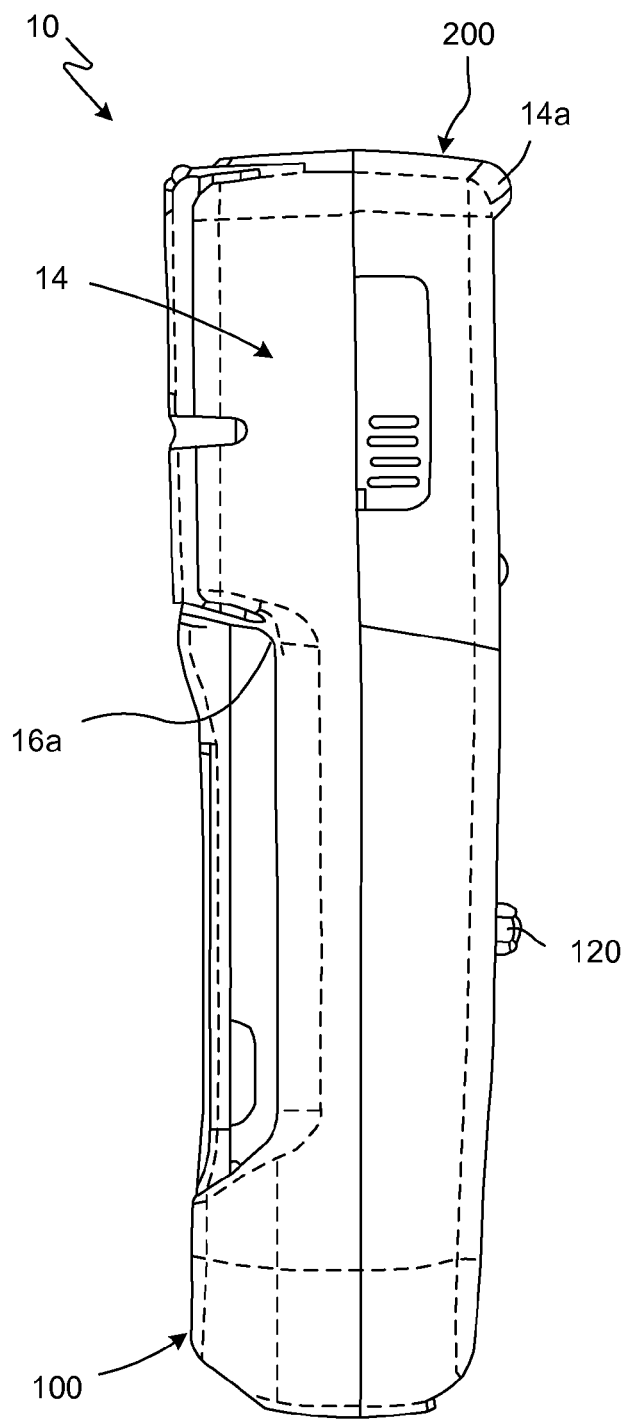
FIG. 2 is a left-side elevation view of the DMM shown in FIG. 1.
Figure 3:
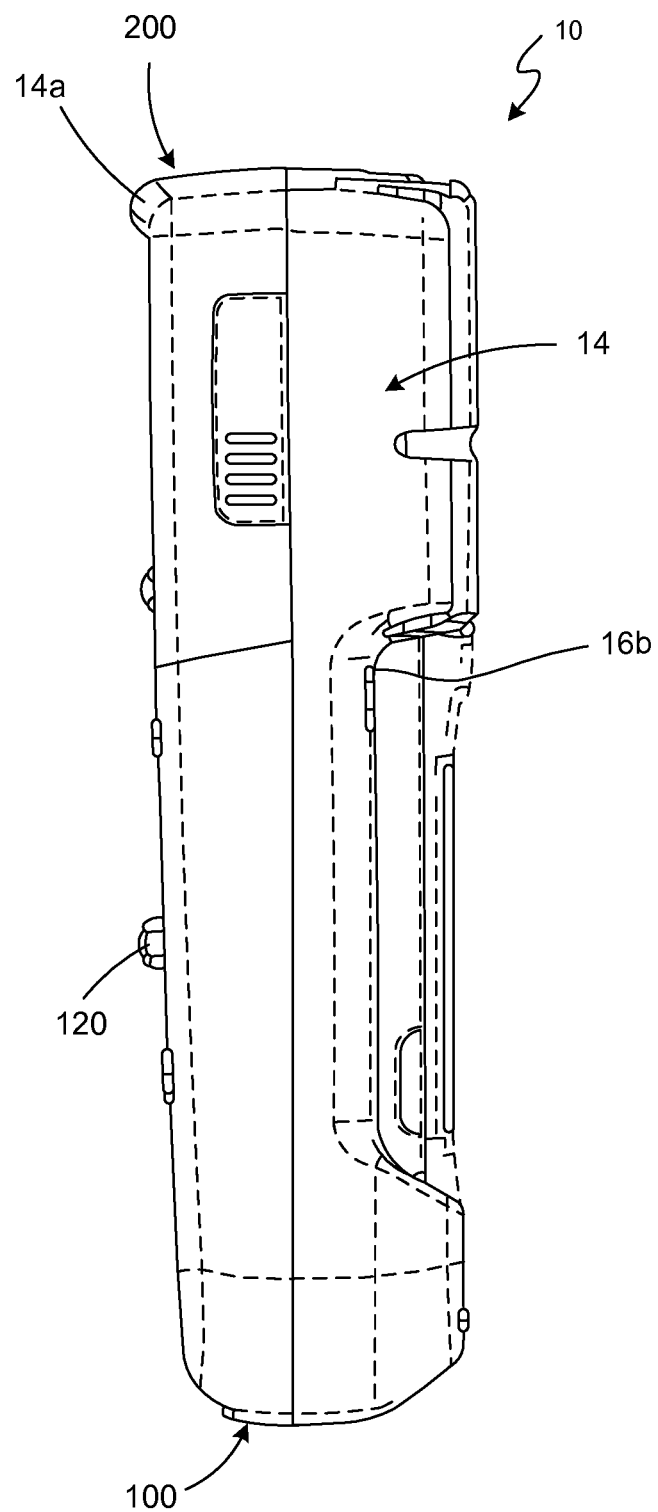
FIG. 3 is a right-side elevation view of the DMM shown in FIG. 1.

Referring additionally to FIGS. 2 (left-side elevation view of the DMM 10) and 3 (right-side elevation view of the DMM 10), the jacket 14 includes pockets 16 (two pockets 16a and 16b are shown in FIGS. 2 and 3, respectively). The pockets 16 provide, for example, hand grips that may allow a user to comfortably and securely grasp the DMM 10. In particular, the jacket 14 includes shoulders formed at the upper and lower ends of the pockets 16. These shoulders may provide ledges that deter the DMM from sliding through an operator's hand.

Figure 4:
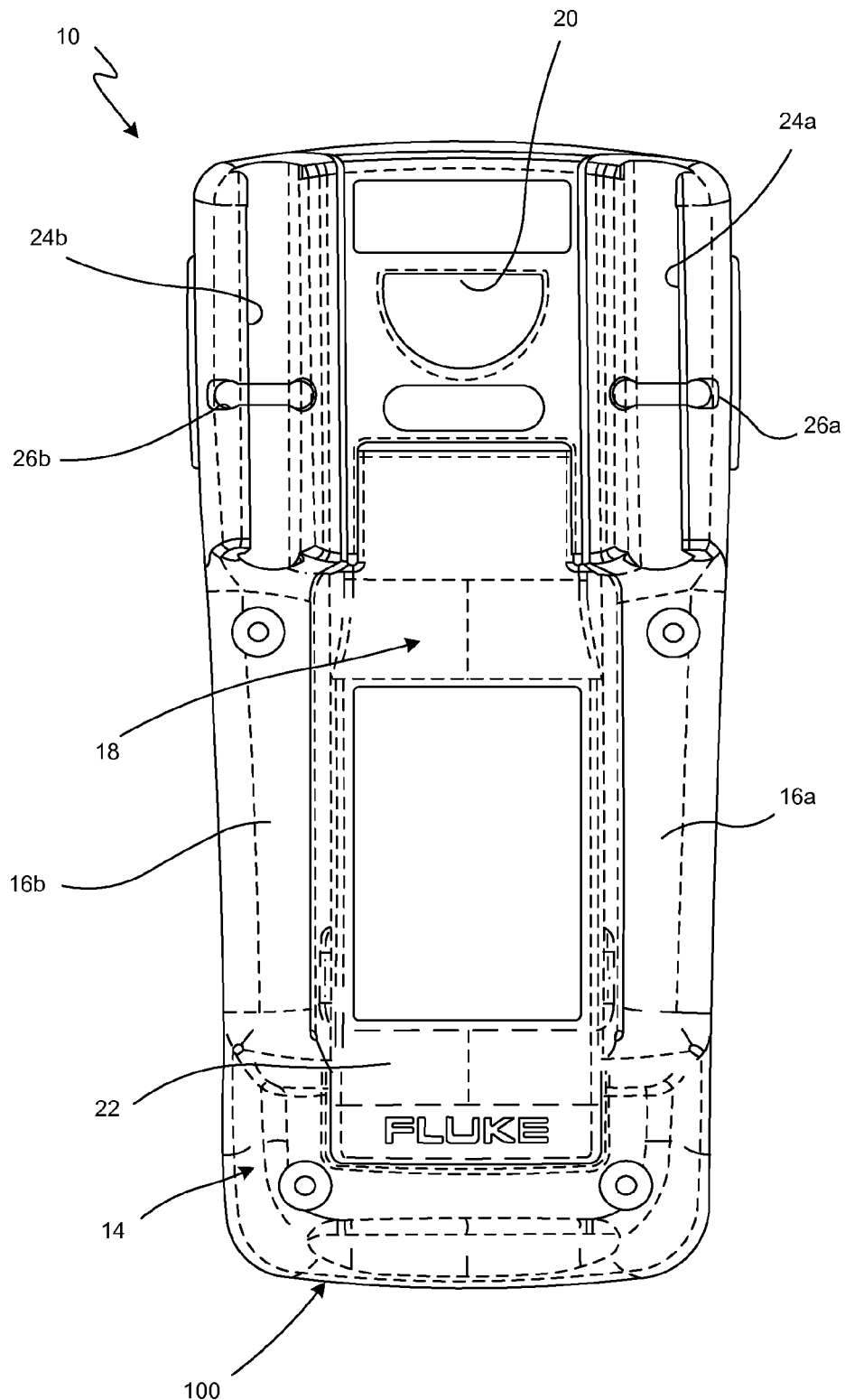
FIG. 4 is a back elevation view of the DMM shown in FIG. 1.
Figure 5:
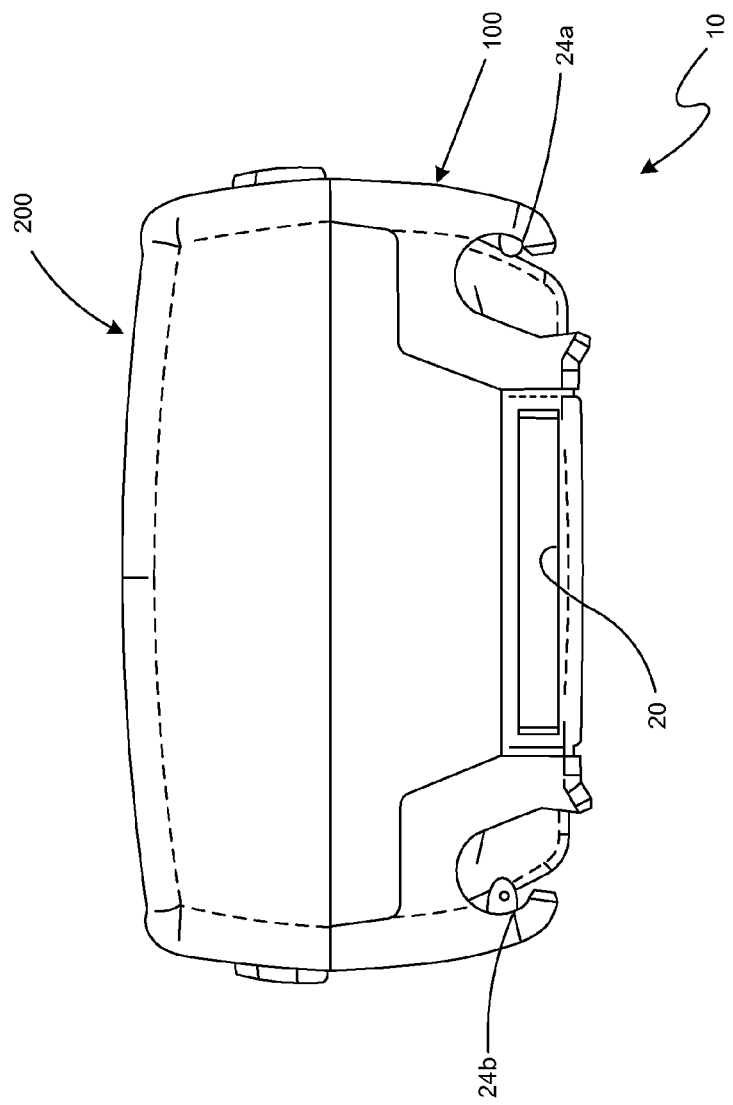
FIG. 5 is a top plan view of the DMM shown in FIG. 1.
Figure 6:
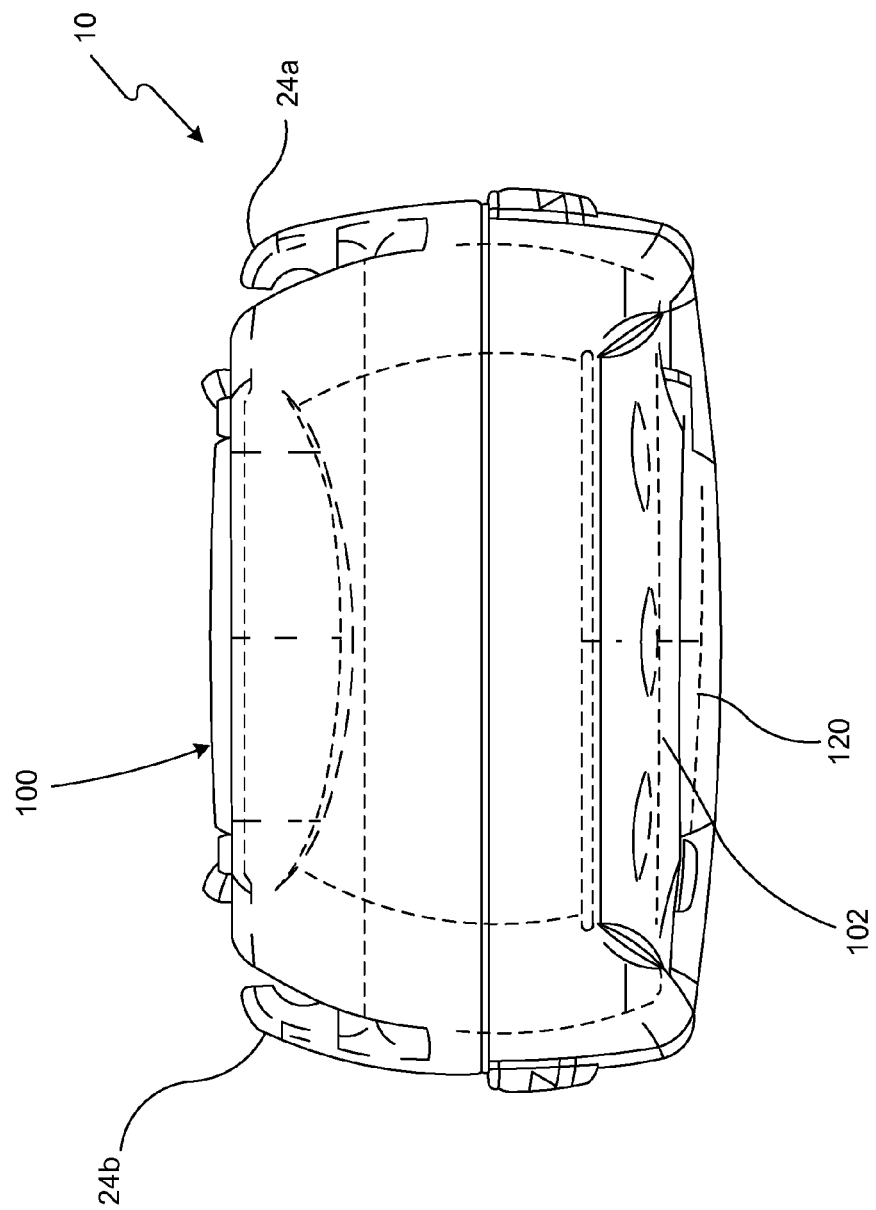
FIG. 6 is a bottom view of the DMM shown in FIG. 1.
Figure 10:
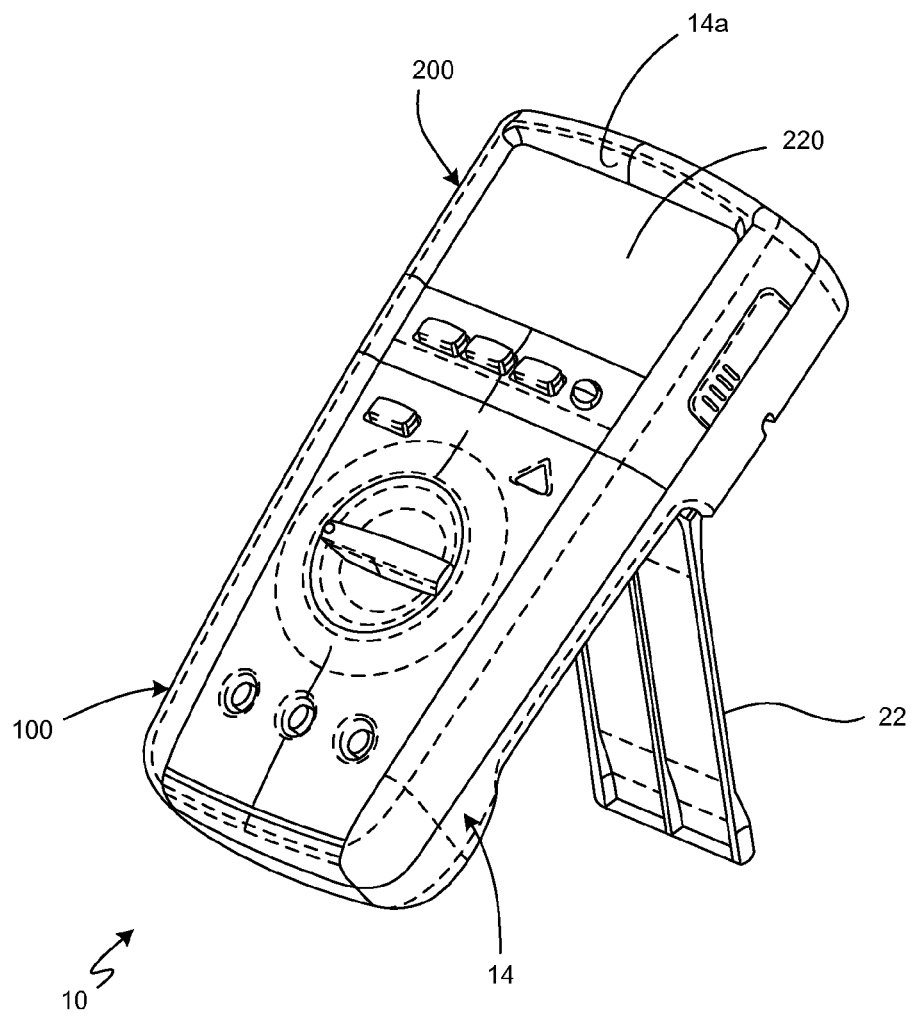
FIG. 10 is a fourth perspective view of the DMM shown in FIG. 1 with a support stand extended.

Referring to FIGS. 4-6, a back side 18 of the DMM 10 is also surrounded by the jacket 14. The back side 18 may include various fittings and features for supporting the DMM 10 or accessories for the DMM 10. For example, an aperture 20 in the back side 18 may provide a receptacle for a mounting bracket (not shown) to support the DMM 10 or to couple an accessory to the DMM 10. A stand 22 may be coupled on the back side 18 so as to pivot between a retracted arrangement as shown in FIGS. 2-6 and an extended arrangement as shown in FIG. 10. In the extended arrangement, the stand 22 may support the DMM 10 in an inclined upright orientation on a support surface, e.g., a table (not shown). The jacket 14 includes probe holders 24 (two probe holders 24a and 24b are shown in FIGS. 4-6) disposed adjacent the pockets 16. Slots 26 (slots 26a and 26b are shown in FIG. 4) may accommodate finger safety guards on the probes (not shown). Certain embodiments according to the present disclosure allow probes to be releasably retained in the probe holders 24 and extend into the pockets 16 such that the probes would not interfere with setting the DMM 10 on a support surface with the back side 18 oriented generally downward. Additionally, at least one of the probe holders 24 may retain a corresponding probe in a projected configuration, e.g., extending beyond the top edge of the DMM 10. Accordingly, one hand of a user may concurrently hold the DMM 10 and apply the projected probe, e.g., contact a circuit, and the user's second hand is free to manipulate a second probe.

Figure 7:
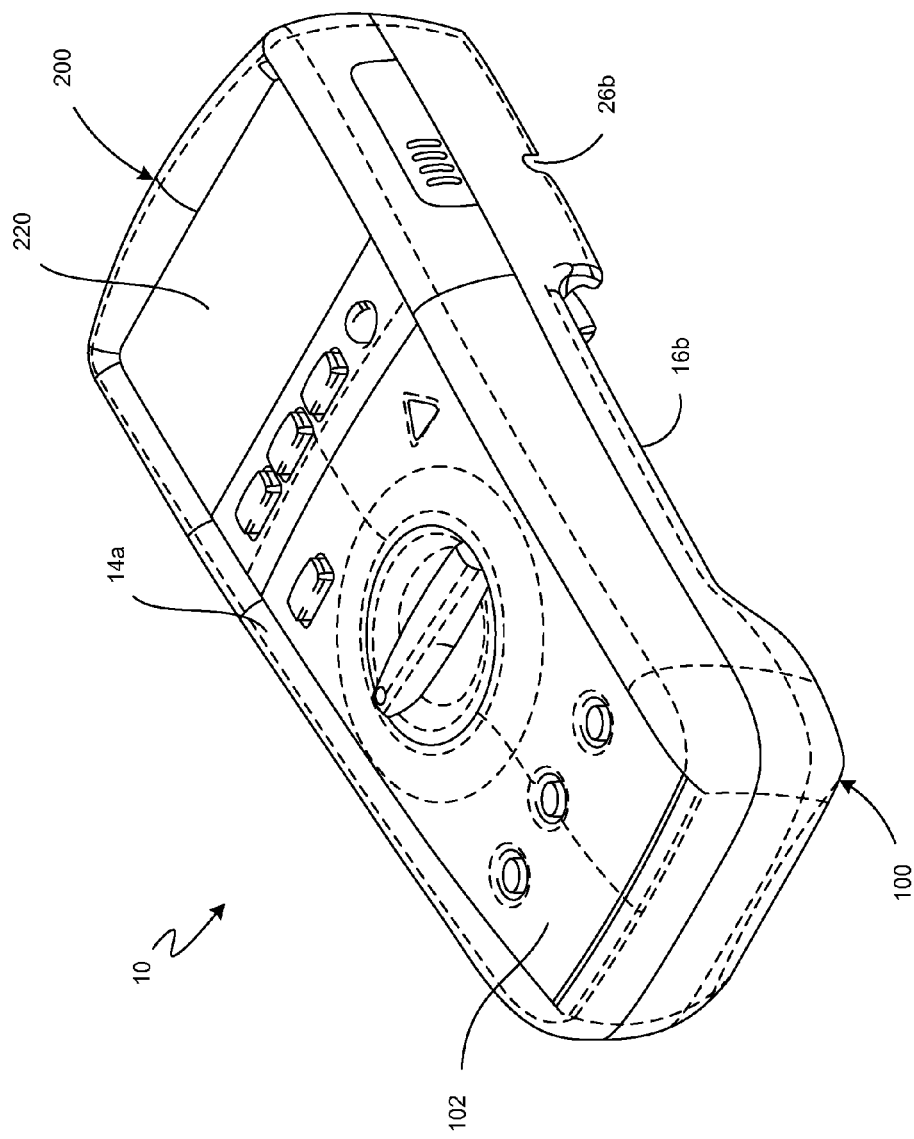
FIG. 7 is a first perspective view of the DMM shown in FIG. 1.
Figure 8:
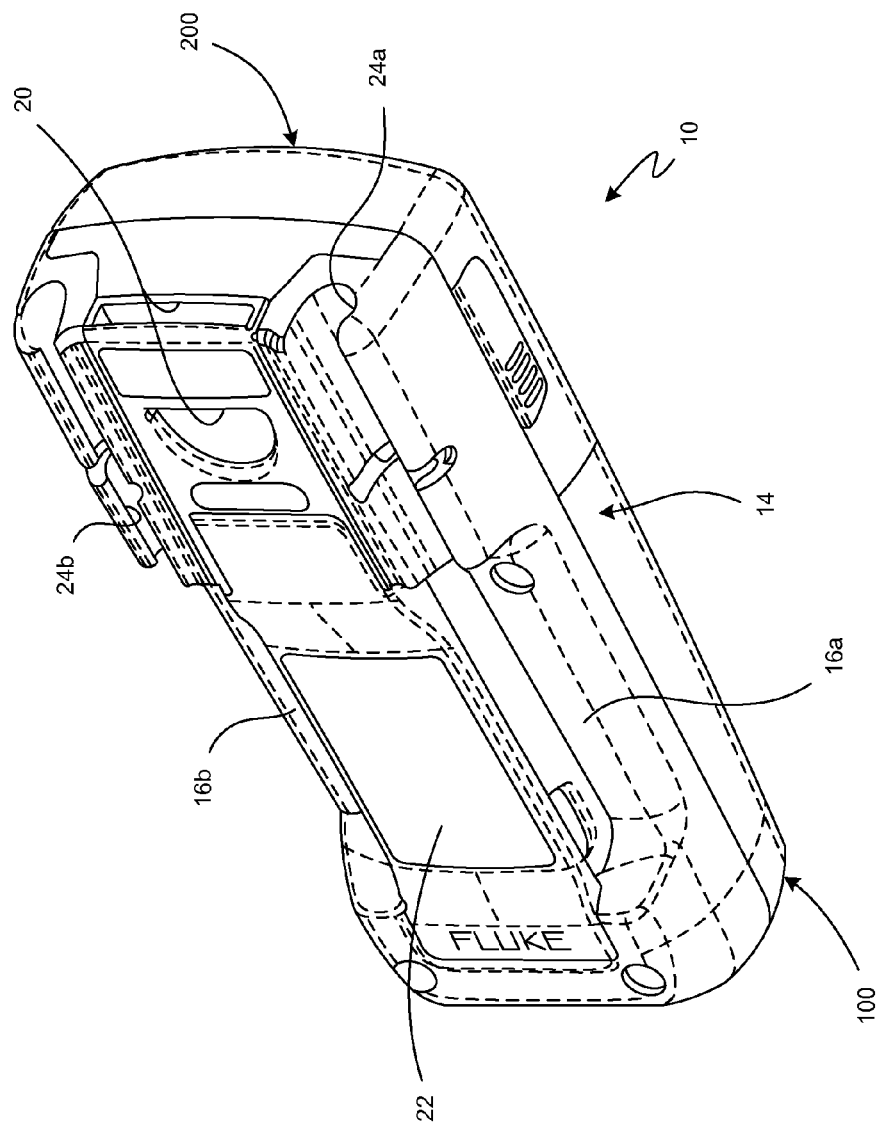
FIG. 8 is a second perspective view of the DMM shown in FIG. 1.
Figure 9:
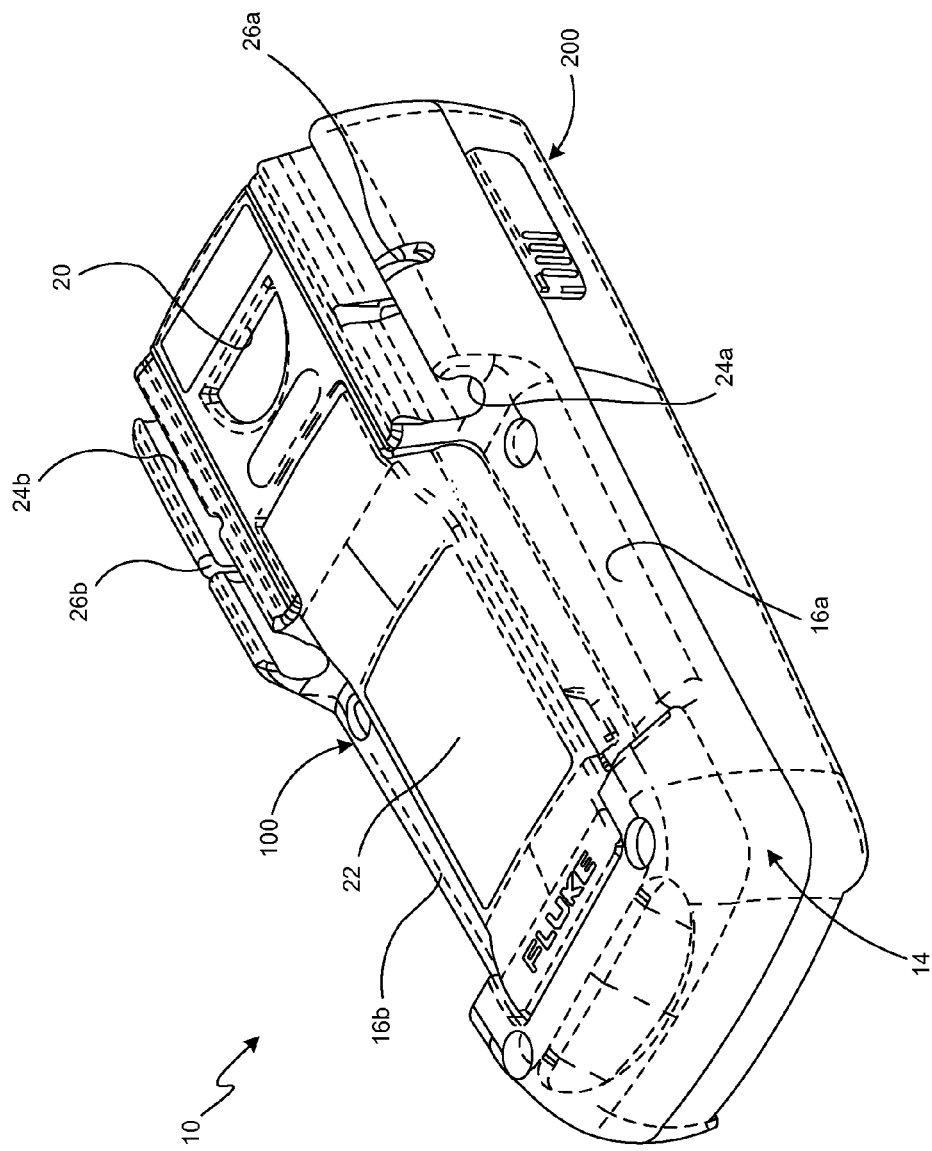
FIG. 9 is a third perspective view of the DMM shown in FIG. 1.

FIGS. 7-9 provide perspective views of the DMM 10 with the stand 22 in the retracted arrangement. In particular, FIG. 7 shows a perspective view including the front, right-side, and bottom of the DMM 10. FIG. 8 shows a perspective view including the back, left-side, and top of the DMM 10. And FIG. 9 shows a perspective view including the back, left-side, and bottom of the DMM 10. FIG. 10 shows a perspective view including front and left-side of the DMM 10 with the stand 22 in the extended arrangement.

Figure 11:
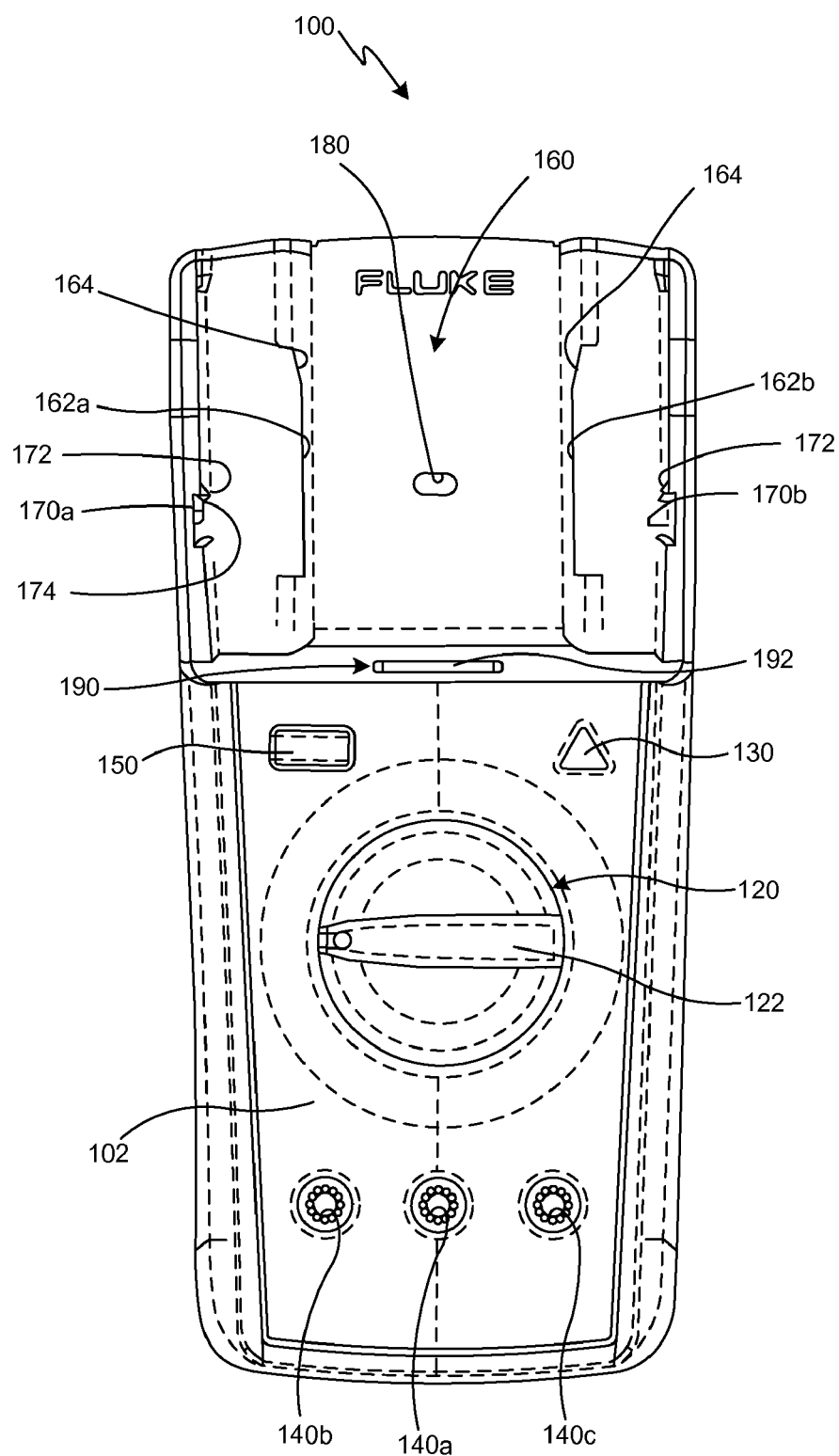
FIG. 11 is front elevation view of a body of a DMM according to an embodiment of the present disclosure.

FIG. 11 is a front elevation view showing the front face 102 of the body 100 including the rotary selector 120, the hazardous voltage indicator 130, the plurality of jacks 140 (three jacks 140a-140c are shown in FIG. 11), and one or more additional controls 150, e.g., one push button is shown in FIG. 11.

The rotary selector 120 may include a knob 122 coupled to a multi-position rotary selector switch (not shown). Alternatively, a linear selector and/or a plurality of push buttons may be used in lieu of the rotary selector 120. Certain embodiments according to the present disclosure include an OFF position for the rotary selector 120 as well as positions for selecting various parameters to be measured, e.g., alternating current (a.c.) voltage and current, direct current (d.c.) voltage and current, resistance, continuity, frequency, capacitance, and/or temperature. Certain other embodiments according to the present disclosure may use the push button 150 in combination with the rotary selector 120 to select the parameter to be measured. For example, a single position of the rotary selector 120 may be used to select either voltage or frequency depending on the state of the push button 150. The additionally controls 150 may additionally or alternatively include, for example, controls for specify ranges or range multipliers.

The hazardous voltage indicator 130 may indicate when the body 100 is connected via the jacks 140 to a predetermined minimum voltage potential, e.g., approximately 30 volts a.c. or d.c., and/or when a voltage overload occurs. The hazardous voltage indicator 130 may include an illuminated beacon as shown in FIG. 11 and/or an audible beacon. The hazardous voltage indicator 130 may be provided on the body 100 because the display 220, which may also provide a hazardous voltage indication, may not be visible when the body 100 and the head 200 are separated.

The jacks 140 provide connections for test leads (not shown) to different functions of the body 100. For example, jack 140a may be for connecting a common test lead, i.e., used in conjunction with one or more the other jacks 140b and 140c, and the jacks 140b or 140c may be for connecting a second test lead used in conjunction with measuring one of resistance, voltage, current, etc.

Referring additionally to FIG. 12-20, the body 100 also includes a first coupler 160 for mechanically coupling the body 100 and the head 200, and also includes a first link 190 for providing a communication link between the body 100 and the head 200. Certain embodiments according to the present disclosure include a first coupler 160 that includes rails 162 (two rails 162a and 162b are shown in FIGS. 11, 15 and 18-20). Each rail 162 may include a chamfered leading end 164 to help align the head 200 with the first coupler 160, and may include a tapered shoulder 166 to reduce or eliminate relative rattling when the head 200 is coupled to the body 100.

The first coupler 160 may also include at least one receiver 170 (two receivers 170a and 170b are shown in FIGS. 11 and 18-20) for mechanically latching the body 100 and the head 200. Certain embodiments according to the present disclosure include a receiver 170 that includes a recess or slot configured to receive a projection from the head 200. Each receiver 170 may include a ramp 172 leading to the receiver and a retaining surface 174 for stopping relative sliding movement tending to separate the head 200 from the body 100.

Figure 19:
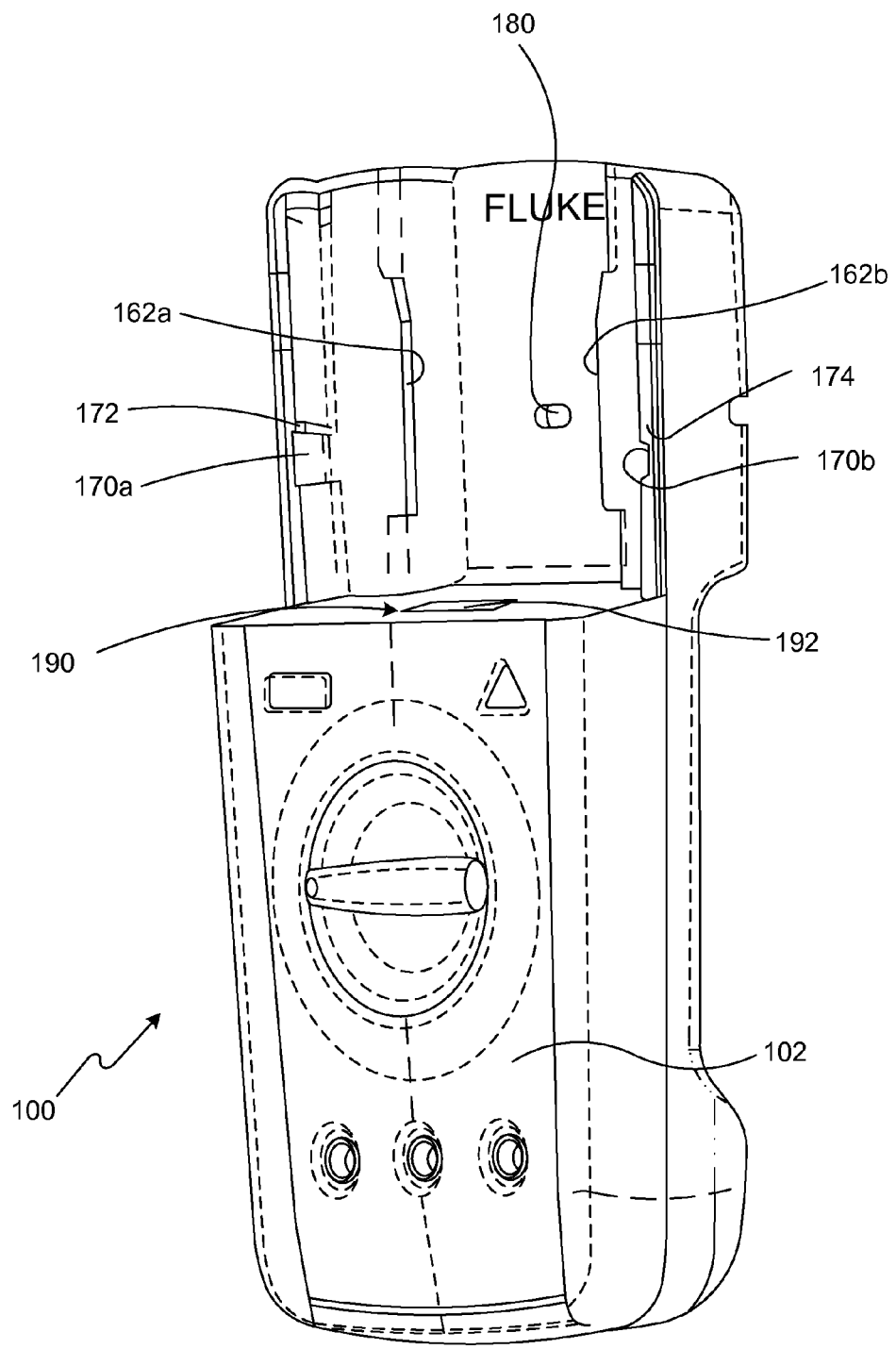
FIG. 19 is a third perspective view of the body shown in FIG. 11.
Figure 20:
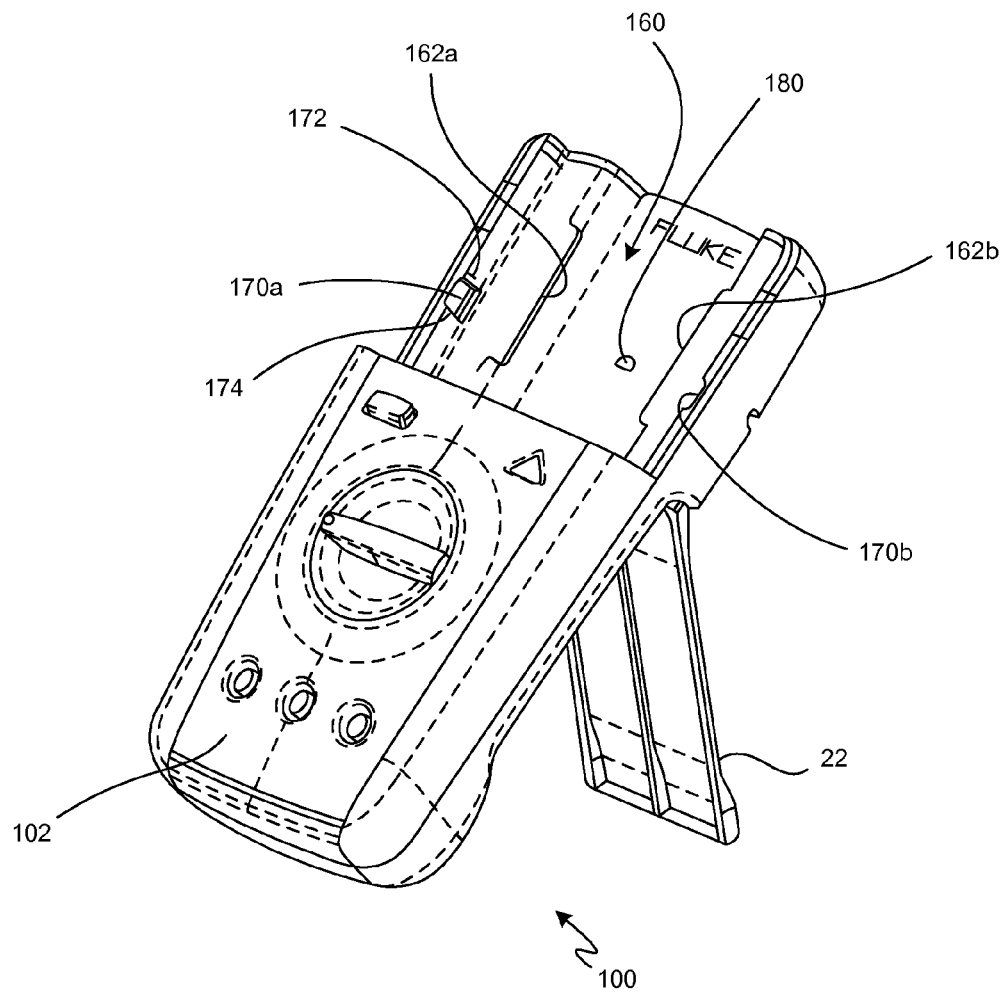
FIG. 20 is a fourth perspective view of the body shown in FIG. 11 with a support stand extended.

The body 100 may also include a lock hole 180 as shown in FIGS. 11, 19 and 20. The lock hole 180 is configured to receive a tip end of a cable lock (not shown) for securing the body 100 with respect to a structure (not shown). The cable lock, which may be similar to corresponding devices for securing laptop computers, may have its tip inserted in the lock hole 180 when the head 200 is separated from the body 100. Accordingly, the body 100 can be secured against theft or inadvertent removal when an operator (not shown) chooses to leave the body 100 at a first location and take the head 200 to a second location that is remote from the first location.

Figure 15:
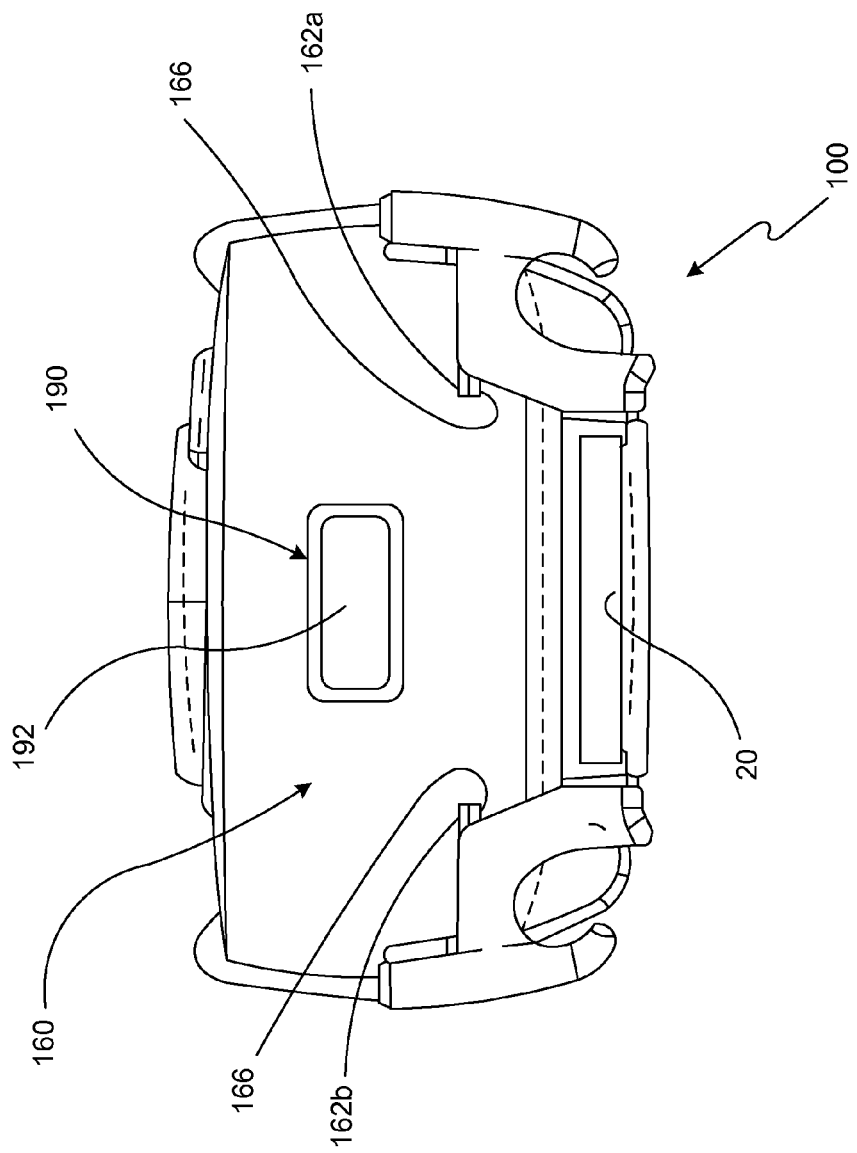
FIG. 15 is a top plan view of the body shown in FIG. 11.
Figure 16:
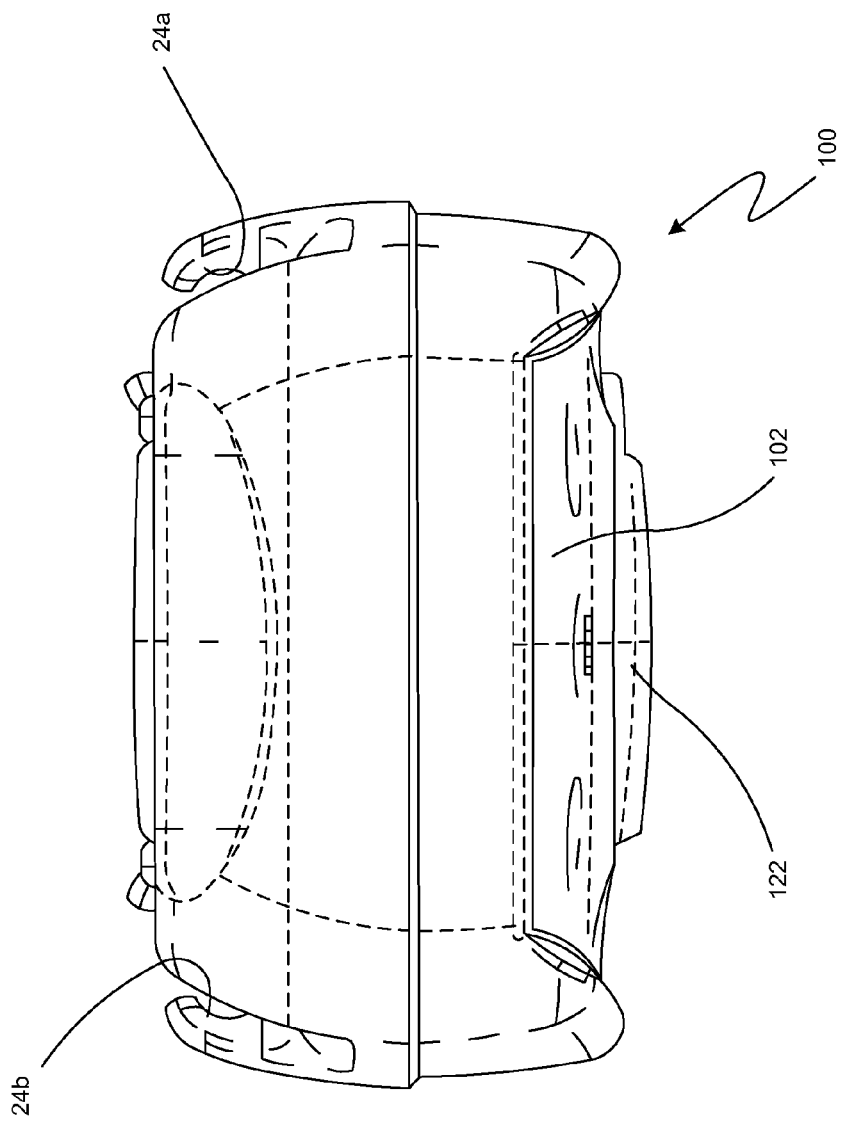
FIG. 16 is a bottom view of the body shown in FIG. 11.
Figure 17:
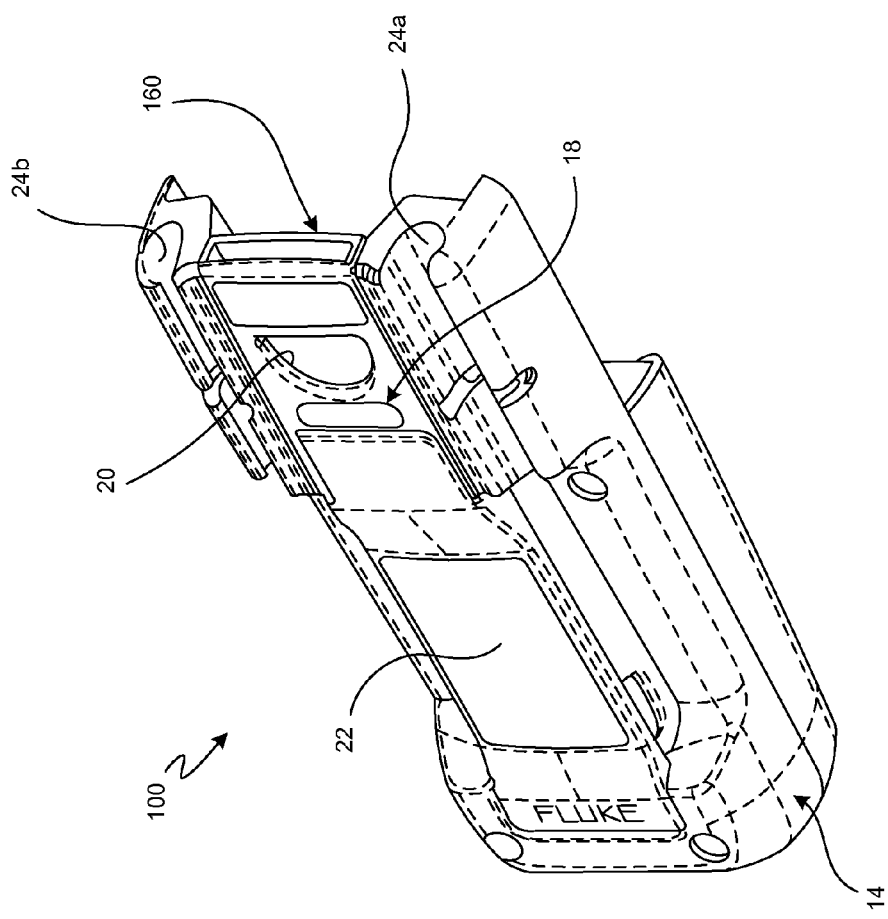
FIG. 17 is a first perspective view of the body shown in FIG. 11.
Figure 18:
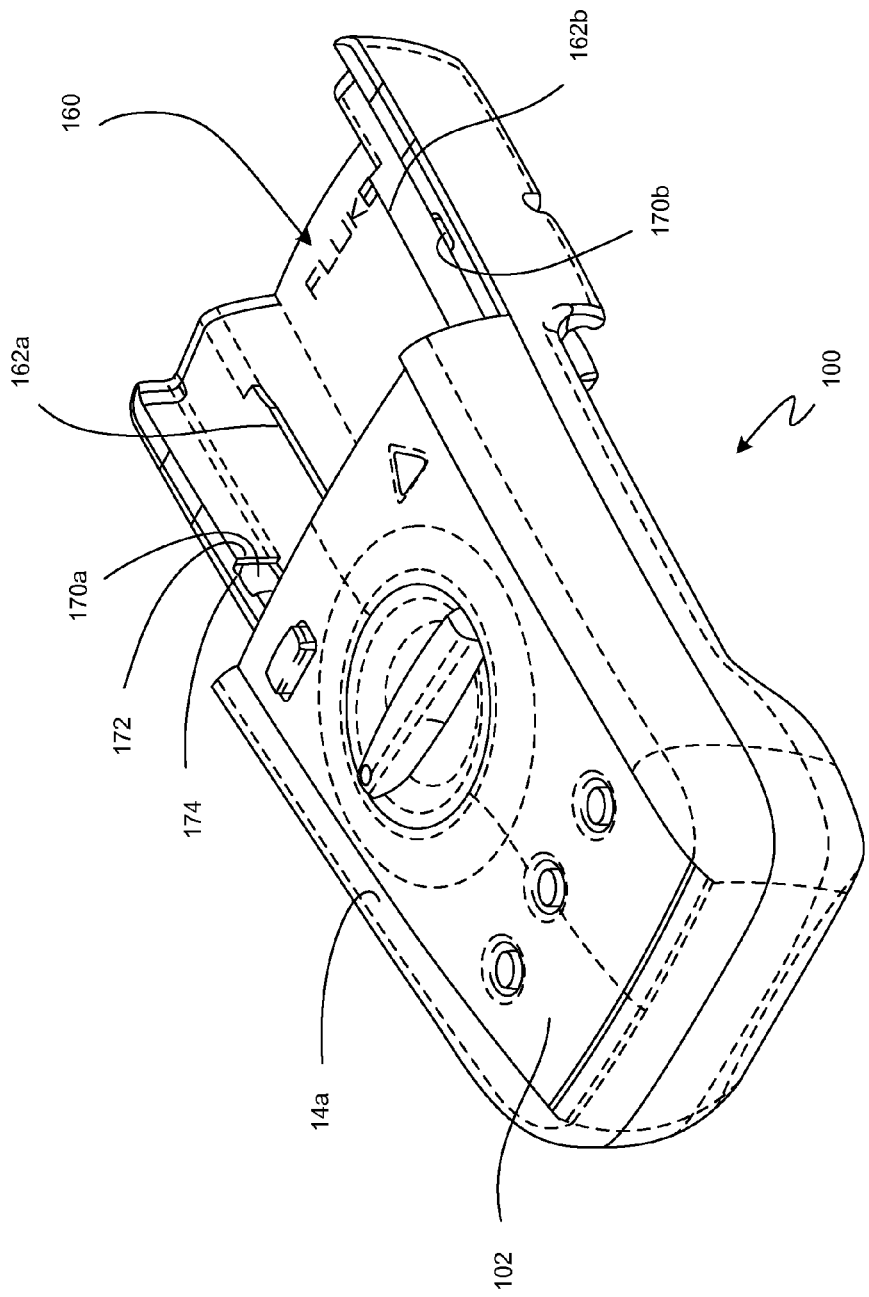
FIG. 18 is a second perspective view of the body shown in FIG. 11.

The first link 190 may include a transceiver 192 as shown in FIGS. 11, 15 and 19 for wirelessly communicating with the head 200. Examples of transceivers 192 include infrared transceivers, radio frequency transceivers, or another suitable transceiver providing communication between the body 100 and the head 200. Additionally or alternatively, the first link 190 may include a jack to which a cable (not shown) may be connected to establish a communication link with the head 200.

The body 100 may include a first power source (not shown), e.g., one or more batteries, disposed in a first chamber (not shown) on the body 100. Certain embodiments according to the present disclosure may include a panel (not shown) for accessing the first chamber and disposed under the stand 22 in the retracted arrangement. Accordingly, access to the first chamber may include pivoting the stand 22 to its extended arrangement and opening, e.g., removing, the panel to remove and/or insert the batteries. Such a first power source may provide energy to the base 100 but not to the head 200.

Figure 12:
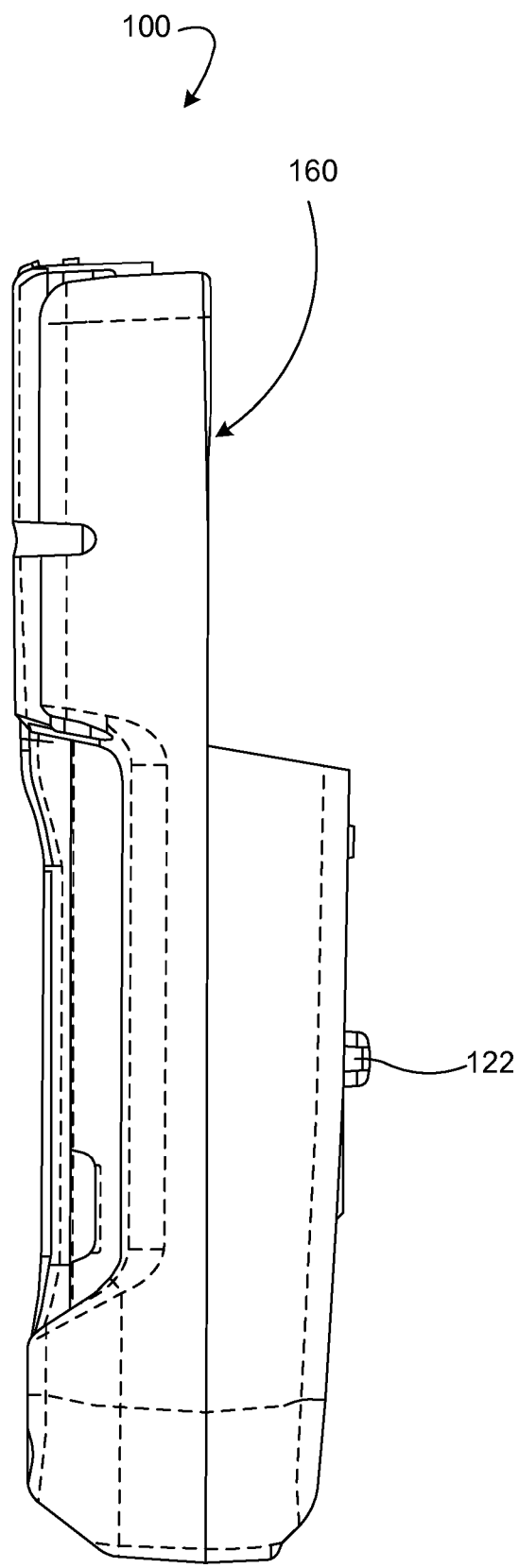
FIG. 12 is a left-side elevation view of the body shown in FIG. 11.
Figure 13:
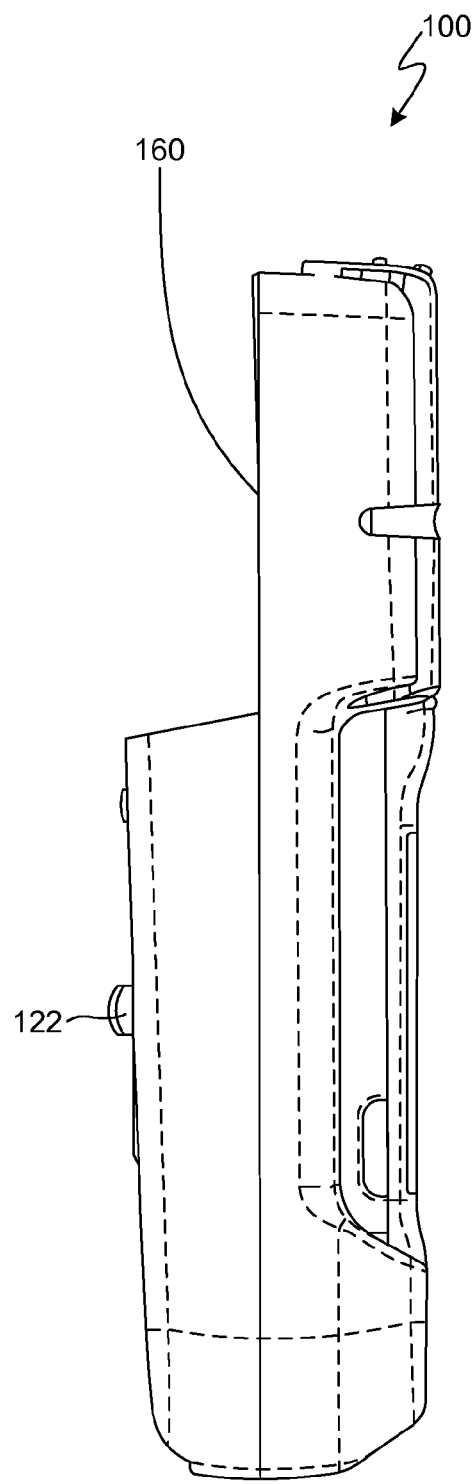
FIG. 13 is a right-side elevation view of the body shown in FIG. 11.
Figure 14:
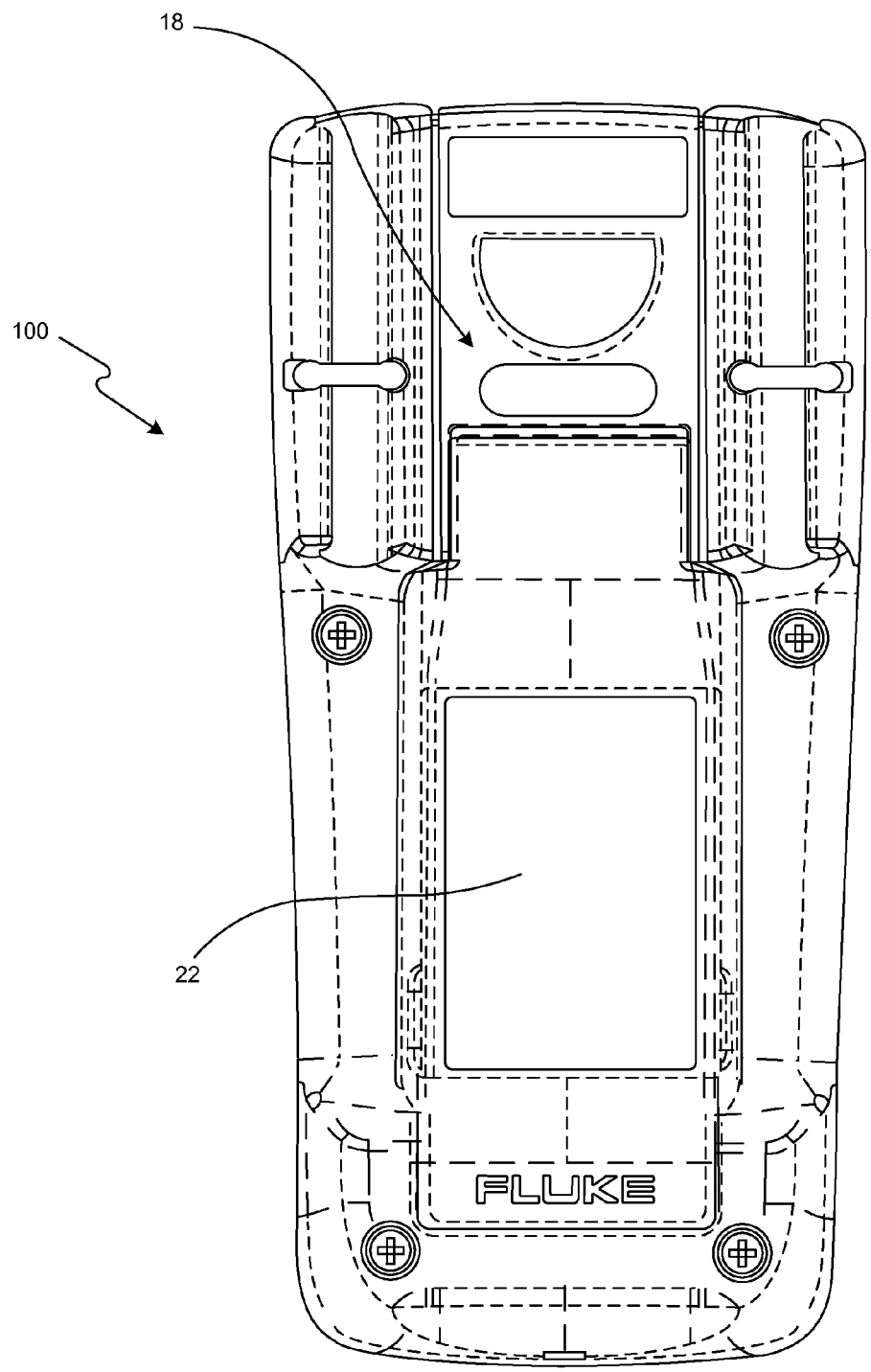
FIG. 14 is a back elevation view of the body shown in FIG. 11.

Referring to FIGS. 12 and 13, the first coupler 160 of the body 100 may be configured as a first-half of a lap joint. Accordingly, the rails 162, the receivers 170 and/or the first link 190 may be disposed on internal surfaces of the first coupler 160, and may not be visible in the overall appearance of the DMM 10, i.e., when the body 100 and head 200 are combined.

Figure 21:
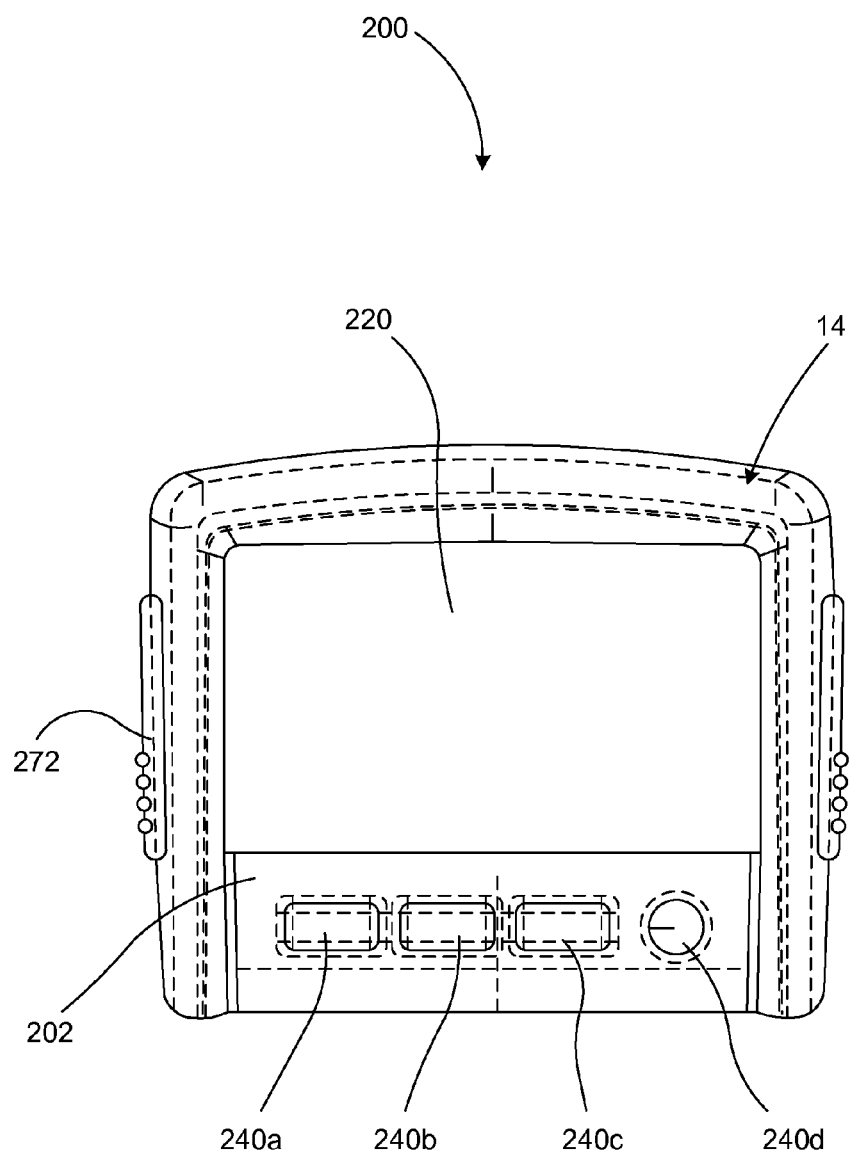
FIG. 21 is front elevation view of a head of a DMM according to an embodiment of the present disclosure.

FIG. 21 is a front elevation view showing the display 220 and at least one control 240 (four push buttons 240a-240d are shown in FIG. 21. The display 220 may show information such as the parameters that are measured by the DMM 10, one or more settings selected by the operator for the DMM 10, etc. The display 220 may include a liquid crystal display (LCD), a set of light emitting diodes (LEDs), or another device suitable for conveying information to the operator.

The display 220 may also indicate when the body 100 is connected to a hazardous voltage condition. For example, the display 220 may indicate a warning message when the body 100 is exposed to a hazardous voltage condition. Additionally or alternatively, the head 200 may include an illuminated beacon (not shown) that is separate from the display 220 and/or include an audible beacon when the body 100 is exposed to a hazardous voltage condition. A hazardous voltage warning indicated by the display 220 and the hazardous voltage indicator 130 that may be provided on the body 100 are redundant because the body 100 and the head 200 may be separated.

Certain embodiments according to the present disclosure may include controls 240 that are associated with predetermined functions, e.g., holding the display of a parameter being measured, showing minimum and/or maximum values of a parameter being measured, and/or setting a range of the display. The controls 240 may additionally or alternatively include "smart" buttons to select settings for the DMM 10 that may be identified in the display 220 immediately above a corresponding control 240. Accordingly, controls 240a-240d may select settings corresponding to a particular setting of the rotary selector switch 120. The controls 240 may also be used in connection with selecting global settings for the DMM 10, selecting a different parameter to be displayed on the display 220, and/or may be used to activate or reset operation of the DMM 10. Yet another option for the controls 240 is to adjust display settings, e.g., backlighting.

Figure 22:
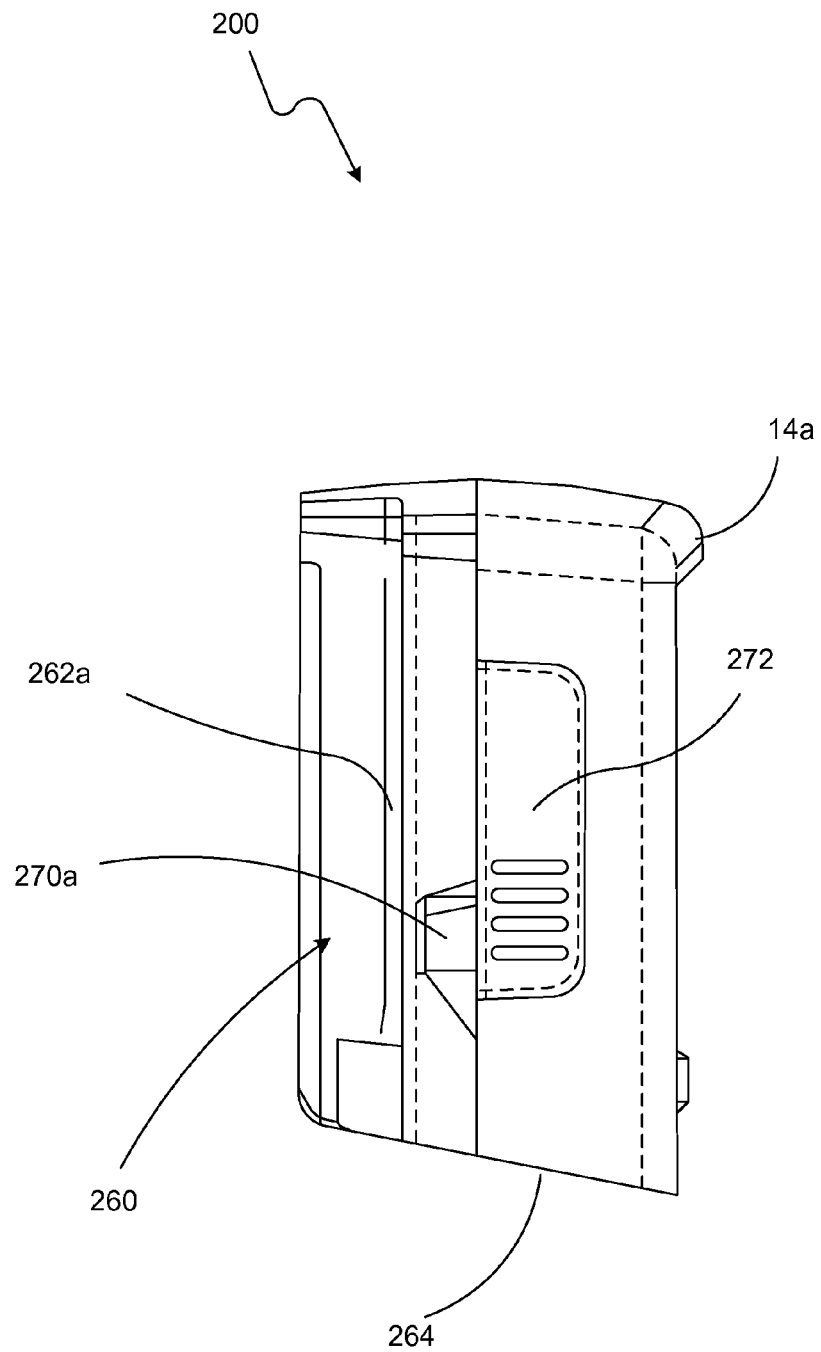
FIG. 22 is a left-side elevation view of the head shown in FIG. 21.
Figure 23:
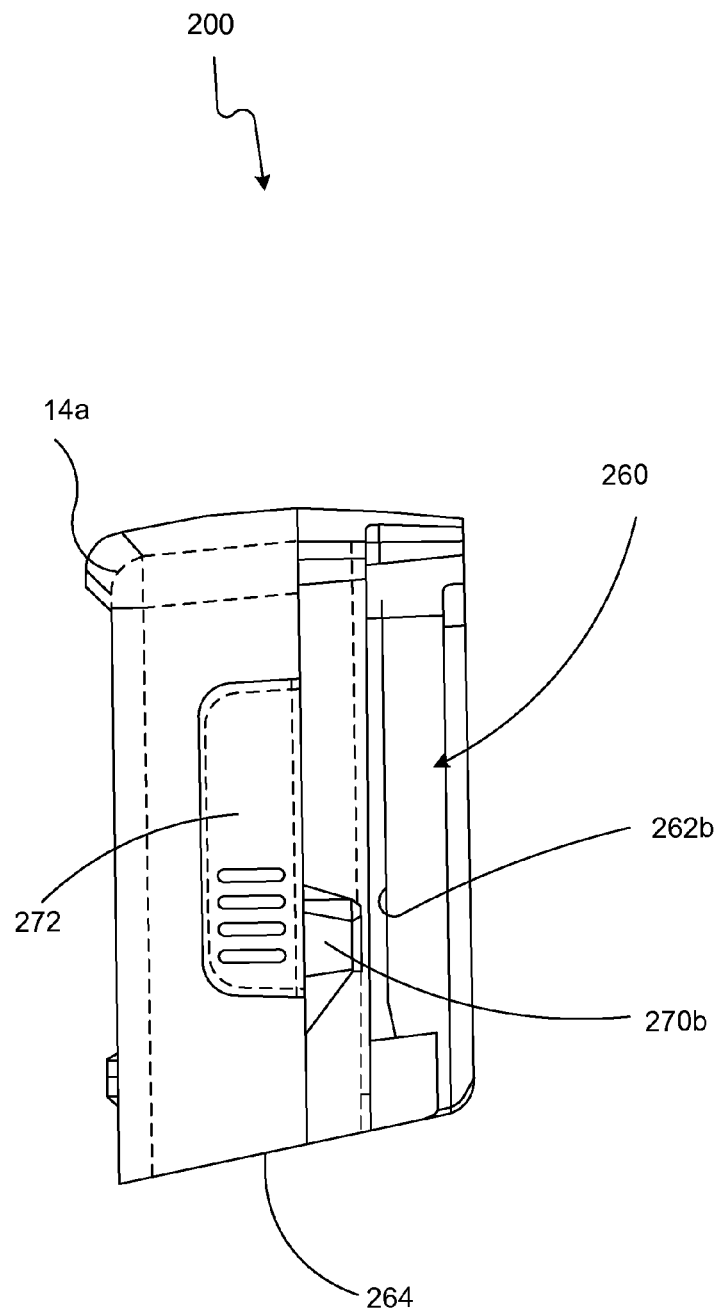
FIG. 23 is a right-side elevation view of the head shown in FIG. 21.
Figure 24:
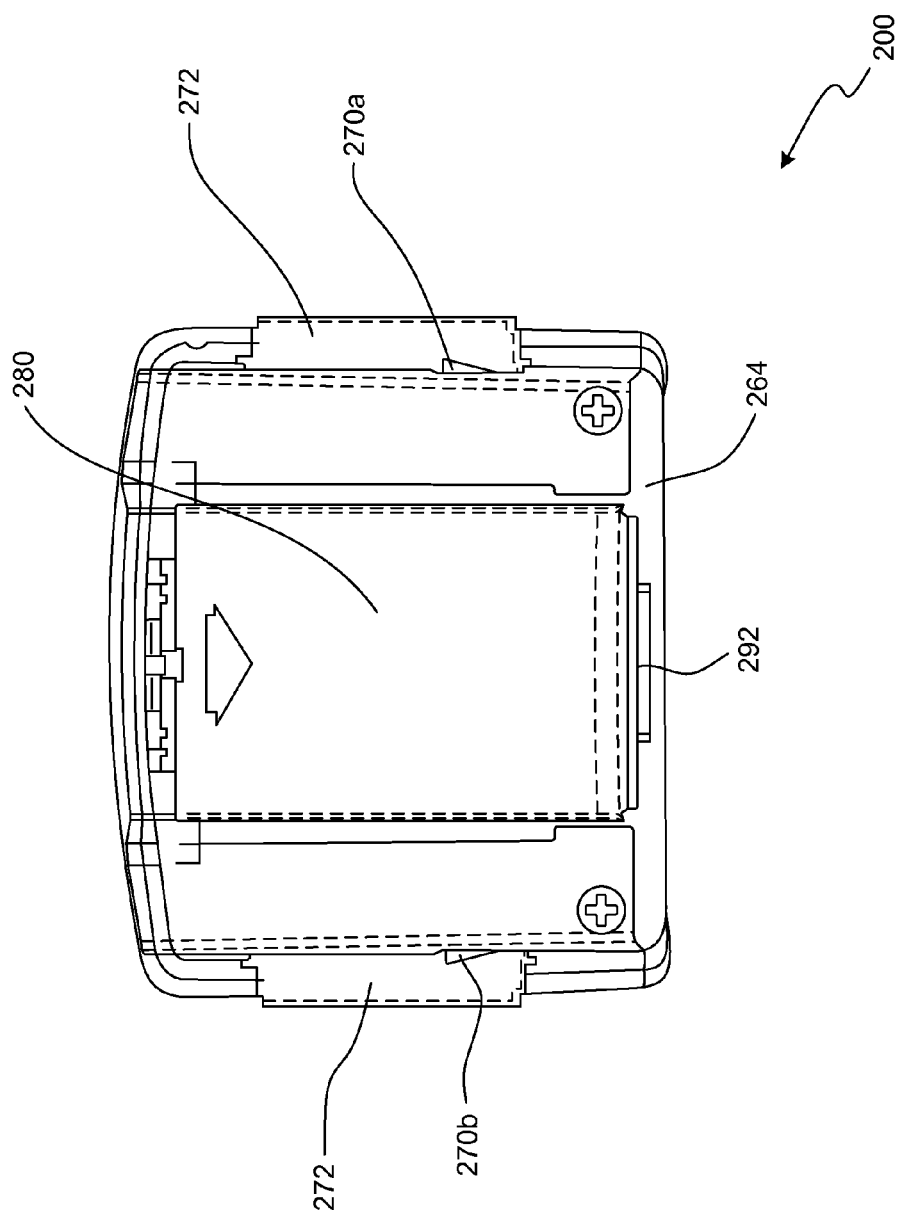
FIG. 24 is a back elevation view of the head shown in FIG. 21.
Figure 25:
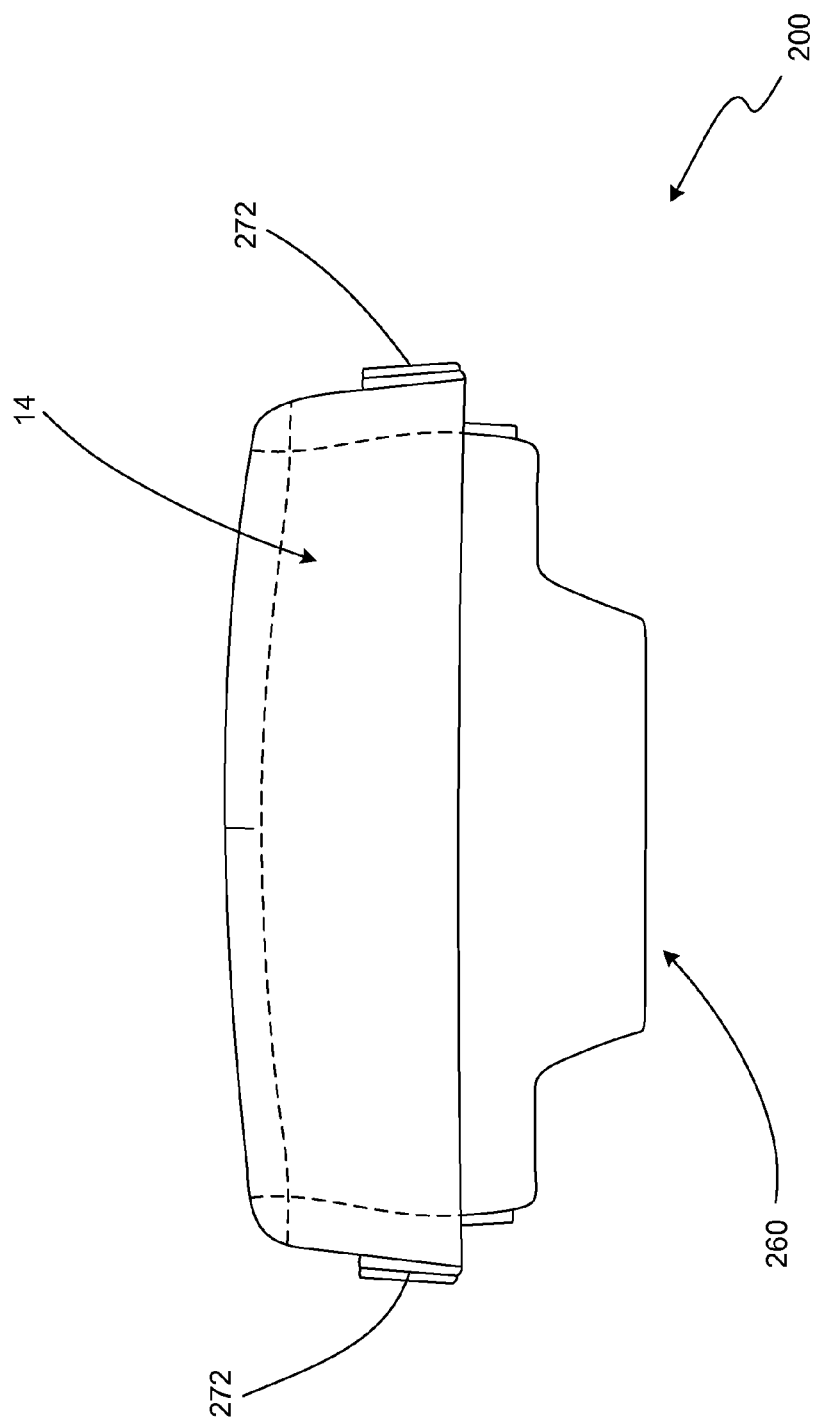
FIG. 25 is a top plan view of the head shown in FIG. 21.

Referring additionally to FIG. 22-28, the head 200 also includes a second coupler 260 for mechanically coupling the body 100 and the head 200, and also includes a second link 290 for electrically linking the body 100 and the head 200. Certain embodiments according to the present disclosure include a second coupler 160 that includes slots 262 (two slots 262a and 262b are shown in FIGS. 22 and 23, respectively). Each slot 262 cooperatively receives a corresponding rail 162 when the head 200 is coupled to the body 100. The head 200 may also be configured with a base 264 surface that is obliquely oriented, e.g., approximately 100 degrees, with respect to the slots 262. Accordingly, the base surface 264 may be placed on a support surface (not shown) so as to present to a user an inclined orientation of the display 220, e.g., approximately ten degrees.

The second coupler 260 may also include at least one projection 270 (two projections 270a and 270b are shown in FIGS. 22 and 23, respectively) for mechanically latching the body 100 and the head 200. Certain embodiments according to the present disclosure include projections 270 that are resiliently biased outward from the head 200 and are coupled to respective actuators 272, e.g., press buttons, on either side of the head 200. Accordingly, pressing the actuators 272 toward one another against the force of a resilient element(s) (not shown) displaces the projections 270 into the head 200 for unlatching the head 200 with respect to body 100. Certain embodiments according to the present disclosure may require both actuators 272 to be concurrently pressed to separate the body 100 and the head 200. In the relatively unlatched configuration of the projections 270 and the receivers 170, the slots 262 on the head 200 may slide along the rails 162 of the body 100 to separate the head 200 from the body 100. In the relatively latched configuration of the projections 270 and the receivers 170, the slots 262 on the head 200 are prevented from sliding along the rails 162 of the body 100 and the head 200 cannot be separated from the body 100.

Figure 26:
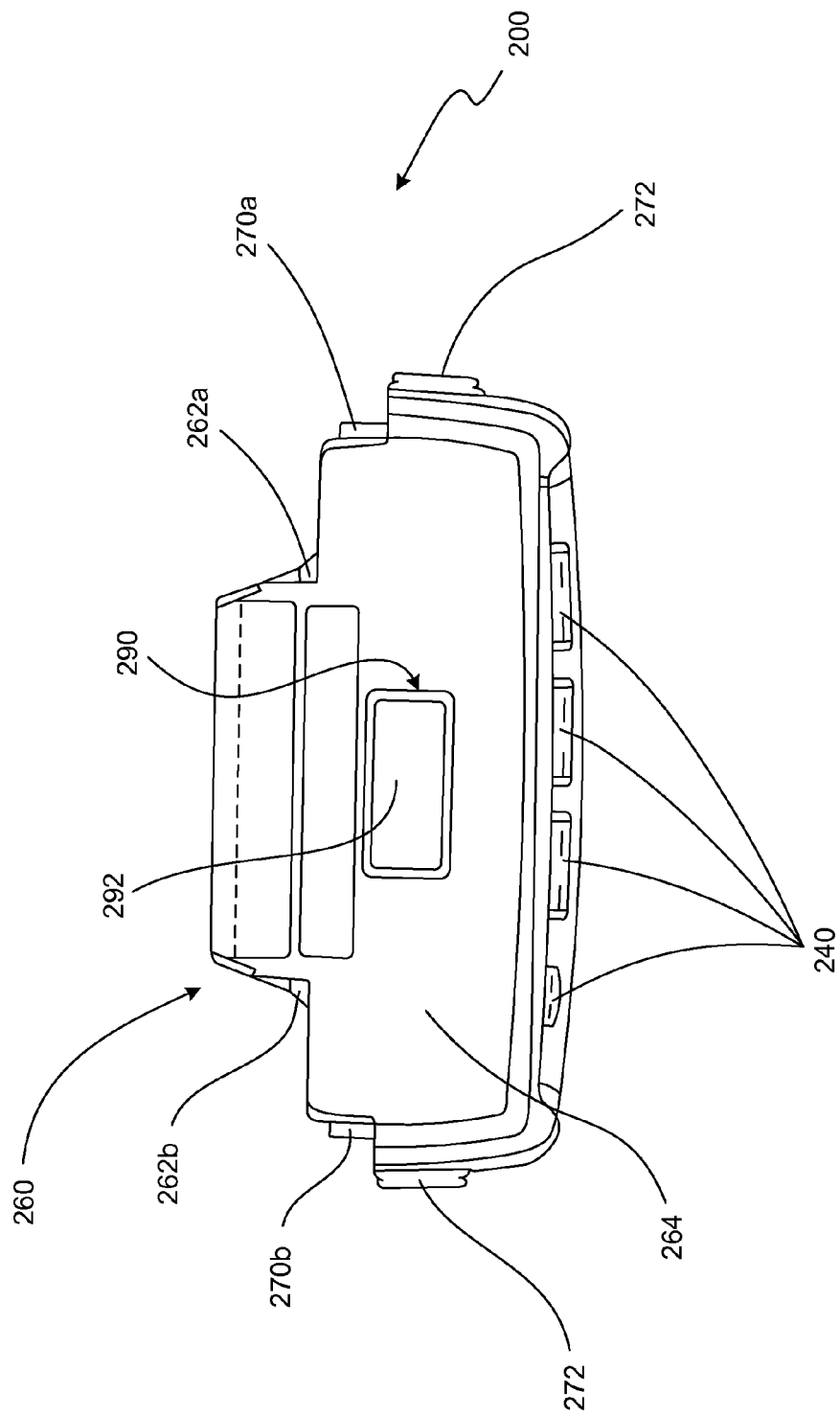
FIG. 26 is a bottom view of the head shown in FIG. 21.
Figure 27:
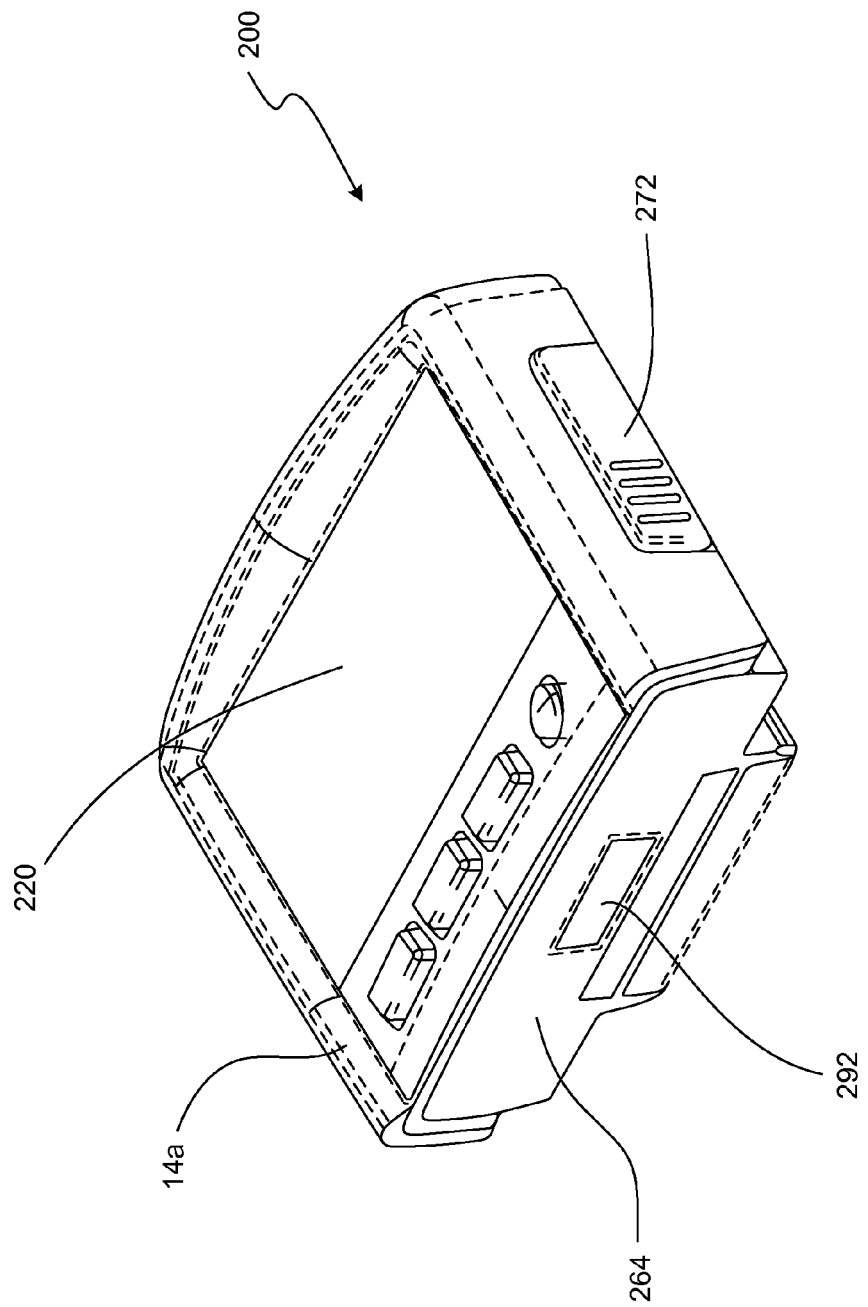
FIG. 27 is a first perspective view of the head shown in FIG. 21.
Figure 28:
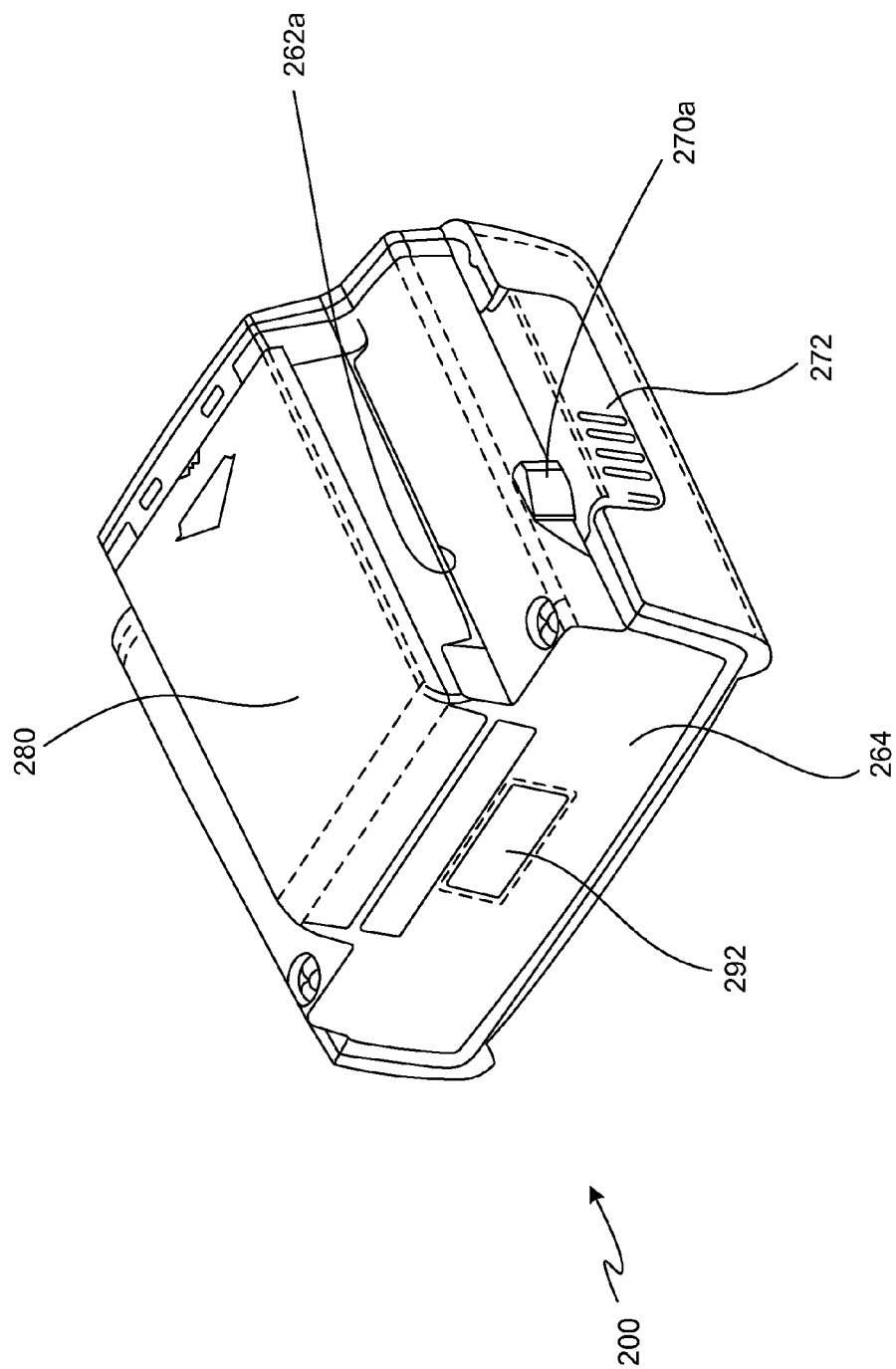
FIG. 28 is a second perspective view of the head shown in FIG. 21.

The second link 290 may also include a transceiver 292 as shown in FIGS. 26-28 for wirelessly communicating with the transceiver 192 of the body 100. Examples of transceivers 292 include infrared transceivers, radio frequency transceivers, or another suitable transceiver providing communication between the body 100 and the head 200. Additionally or alternatively, the second link 290 may include a jack to which a cable (not shown) may be connected to establish a communication link with the body 100.

The head 200 may include a second power source (not shown), e.g., one or more batteries, disposed in a second chamber (not shown) on the head 200. Such a second power source may provide energy to the head 200 but not to the base 100. The head 200 may include a panel 280 for accessing the second chamber. Certain embodiments according to the present disclosure may include a permanent magnet (not shown) fixed to the panel 280. The permanent magnet may provide sufficient holding power with respect to a ferrous structure (not shown) to support the head 200 when separated from the body 100.

The second coupler 260 of the head 200 may be configured as a second-half of a lap joint. Accordingly, the slots 262, the projections 270, the panel 280, and the second link 290 may be disposed on internal surfaces of the second coupler 260, and may not be visible in the overall appearance of the DMM 10, i.e., when the body 100 and head 200 are combined. The actuators 272 are, however, visible and accessible for separating the body 100 and head 200.

Certain embodiments according to the present disclosure can measure an electrical parameter at a first location and display the measured parameter at a second location that is remote from the first location. For example, a DMM can include a body and a head that may be separated from the body. The body may include a parameter measuring selector switch and jacks for test leads, and the head may include a display for displaying the measured parameter. Individual power sources and/or separate hazardous voltage indicators for the head and the body may be provided because the body and the head of a DMM can be separated. The form of the coupling between the body and the head may be a lap joint to preserve a traditional appearance of a conventional DMM. Alternative forms of couplings include a butt coupling or an insert coupling wherein a display unit may be inserted in a surrounding frame formed by a main unit. Certain embodiments according to the present disclosure provide rails on one of a body and a head and slots on the other of the body and head that cooperatively engage with the slots. Similarly, one or more receivers are provided on one of a body and a head and one or more projections are provided on the other of the body and head to cooperatively engage the receivers in a latched configuration of the body and head.

Specific details of the embodiments of the present disclosure are set forth in the description and in the figures to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the present disclosure.

Unless the context clearly requires otherwise, throughout the description and the claims, the words "comprise", "comprising", and the like are to be construed in an inclusive sense, as opposed to an exclusive or exhaustive sense; that is to say, in the sense of including, but not limited to. Additionally, the words "herein", "above", "below", and words of similar connotation, when used in the present disclosure, shall refer to the present disclosure as a whole and not to any particular portions of the present disclosure. Where the context permits, words in the above Detailed Description using the singular or plural number may also include the plural or singular number respectively. The word "or", in reference to a list of two or more items, covers all of the following interpretations of the word: any of the items in the list, all of the items in the list, and any combination of the items in the list.

The above detailed description of embodiments is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

The invention claimed is:

1. A digital multimeter, comprising:
a body including a function selector and a first coupler, the function selector being configured to select a parameter to be measured; and
a head including a display and a second coupler corresponding to the first coupler on the body, the display being configured to display a measurement corresponding to the parameter to be measured;
wherein the first and second couplers are engaged in a first arrangement joining the body and the head in a substantially rigid arrangement, and the first and second couplers are disengaged in a second arrangement separating the body and the head; and
wherein the digital multimeter is operational in the first arrangement and in the second arrangement.

2. The digital multimeter of claim 1, further comprising a wireless link electrically coupling the function selector and the display.

3. The digital multimeter of claim 1 wherein the body comprises a hazardous voltage indicator and the display is configured to display a hazardous voltage warning.

4. The digital multimeter of claim 1 wherein the body includes a first power source and the head includes a second power source.

5. The digital multimeter of claim 1 wherein the first and second couplers comprise a lap joint in the first arrangement.

6. The digital multimeter of claim 1 wherein the head comprises a first support configured to support the remote in the second arrangement.

7. The digital multimeter of claim 6 wherein the first support comprises a permanent magnet.

8. The digital multimeter of claim 6 wherein the body comprises a second support configured to support the body in the second arrangement.

9. The digital multimeter of claim 8 wherein the second support is configured to support the body and the head in the first arrangement.

10. The digital multimeter of claim 8 wherein the second support comprises a stand pivotally coupled to the body.

11. The digital multimeter of claim 1, further comprising a latch, wherein the latch retains the body and the head in the first arrangement.

12. The digital multimeter of claim 1 wherein the head comprises at least one display control.

13. A digital multimeter, comprising:
a body including a function selector and a first coupler; and
a head including a display and a second coupler corresponding to the first coupler;
wherein the body and the head are configured to be separated and rejoined to a substantially rigid arrangement; and
wherein the digital multimeter is configured to be operational when the body and the head are separated.

14. The digital multimeter of claim 13, further comprising:
a mechanical coupling configured to join the body and head; and
an electrical coupling configured to communicate between the function selector and the display.

15. The digital multimeter of claim 14 wherein the mechanical coupling comprises at least one rail and at least one slot configured to cooperatively engage the at least one rail.

16. The digital multimeter of claim 14 wherein the electrical coupling comprises a wireless communication link.

17. A method of remotely displaying a measured electrical parameter with respect to measuring the electrical parameter, the method comprising:
disjoining a display with respect to a body, the display being configured to display the measured electrical parameter and the body including a function selector being configured to select the electrical parameter, wherein the head and the body comprise a pair of corresponding couplers capable of joining the head and the body in a substantially rigid arrangement, and wherein the body and the head are configured to be operational whether disjoined or rejoined; and communicating the measured electrical parameter from the body to the display.

18. The method of claim 17, further comprising rejoining the display and the body.

19. The method of claim 17, further comprising individually powering the display and the body with separate power sources.

20. The method of claim 17, further comprising individually indicating at the display and the body a hazardous voltage condition.

* * * * *